United States Patent
Ueno et al.

(10) Patent No.: US 8,908,732 B2
(45) Date of Patent: Dec. 9, 2014

(54) GROUP-III NITRIDE SEMICONDUCTOR LASER DEVICE

(71) Applicants: Sumitomo Electric Industries, Ltd., Osaka-shi (JP); Sony Corporation, Tokyo (JP)

(72) Inventors: Masaki Ueno, Itami (JP); Koji Katayama, Osaka (JP); Takatoshi Ikegami, Osaka (JP); Takao Nakamura, Itami (JP); Katsunori Yanashima, Kanagawa (JP); Hiroshi Nakajima, Kanagawa (JP)

(73) Assignees: Sumitomo Electric Industries, Ltd., Osaka-Shi (JP); Sony Corporation, Tokyo (JP)

(*) Notice: Subject to any disclaimer, the term of this patent is extended or adjusted under 35 U.S.C. 154(b) by 0 days.

(21) Appl. No.: 13/896,918

(22) Filed: May 17, 2013

(65) Prior Publication Data
US 2013/0308670 A1    Nov. 21, 2013

Related U.S. Application Data

(60) Provisional application No. 61/649,109, filed on May 18, 2012, provisional application No. 61/668,925, filed on Jul. 6, 2012.

(51) Int. Cl.
| | |
|---|---|
| *H01S 5/00* | (2006.01) |
| *H01S 5/028* | (2006.01) |
| *H01S 5/22* | (2006.01) |
| *H01S 5/30* | (2006.01) |
| *H01S 5/343* | (2006.01) |
| *H01S 5/32* | (2006.01) |
| *H01S 5/20* | (2006.01) |
| *H01S 5/02* | (2006.01) |

(52) U.S. Cl.
CPC ............... *H01S 5/3013* (2013.01); *H01S 5/22* (2013.01); *H01S 5/3063* (2013.01); *H01S 5/34333* (2013.01); *H01S 5/3213* (2013.01); *H01S 5/3202* (2013.01); *H01S 5/2031* (2013.01); *H01S 5/0287* (2013.01); *H01S 5/0202* (2013.01)
USPC .............. 372/43.01; 372/44.011; 372/45.012; 372/46.01; 372/49.01

(58) Field of Classification Search
USPC .................. 372/43.01, 44.011, 45.012, 46.01
See application file for complete search history.

(56) References Cited

U.S. PATENT DOCUMENTS

2010/0085997 A1* 4/2010 Nishikawa et al. ......... 372/46.01
2011/0075695 A1* 3/2011 Yoshizumi et al. ...... 372/45.011

FOREIGN PATENT DOCUMENTS

| JP | 2000-216476 A | 8/2000 |
| JP | 2005-340625 A | 12/2005 |

(Continued)

OTHER PUBLICATIONS

Stephan Lutgen et al., "Recent results of blue and green InGaN laser diodes for laser projection," Proc. SPIE vol. 7953, 2011, pp. 79530G-1-79530G-12.

(Continued)

*Primary Examiner* — Dung Nguyen
(74) *Attorney, Agent, or Firm* — Venable LLP; Michael A. Sartori; George L. Howarah

(57) ABSTRACT

A group-III nitride semiconductor laser device comprises: a laser structure including a semiconductor region and a support base having a semipolar primary surface of group-III nitride semiconductor; a first reflective layer, provided on a first facet of the region, for a lasing cavity of the laser device; and a second reflective layer, provided on a second facet of the region, for the lasing cavity. The laser structure includes a laser waveguide extending along the semipolar surface. A c+ axis vector indicating a <0001> axial direction of the base tilts toward an m-axis of the group-III nitride semiconductor at an angle of not less than 63 degrees and less than 80 degrees with respect to a vector indicating a direction of an axis normal to the semipolar surface. The first reflective layer has a reflectance of less than 60% in a wavelength range of 525 to 545 nm.

19 Claims, 16 Drawing Sheets

(56) References Cited

FOREIGN PATENT DOCUMENTS

| JP | 2008-244454 A | 10/2008 |
|---|---|---|
| JP | 2010-232517 A | 10/2010 |
| JP | 2011-003660 A | 1/2011 |
| JP | 2011-077393 A | 4/2011 |

OTHER PUBLICATIONS

Takashi Miyoshi et al., "InGaN-based 518 and 488 nm laser diodes on c-plane GaN substrate," Phys. Status Solidi A 207, No. 6, 2010, pp. 1389-1392.

James W. Raring et al., "High-Efficiency Blue and True-Green-Emitting Laser Diodes Based on Non-c-Plane Oriented GaN Substrates," Applied Physics Express 3, 2010, pp. 112101-1-112101-3.

Dmitry Sizov et al., "60mW Pulsed and Continuous Wave Operation of GaN-Based Semipolar Green Laser with Characteristic Temperarture of 190K," Applied Physics Express 4, 2011, pp. 102103-1-102103-3.

You-Da Lin et al., "High Quality InGaN/AlGaN Multiple Quantam Wells for Semipolar InGaN Green Laser Diodes," Applied Physics Express 3, 2010, pp. 082001-1-082001-3.

Takashi Miyoshi et al., "510-515 nm InGaN-Based Green Laser Diodes on c-Plane GaN Substrate," Applied Physics Express 2, 2009, pp. 062201-1-062201-3.

International Search Report in PCT International Application No. PCT/JP2013/054556, dated Mar. 19, 2013.

\* cited by examiner

Fig.2
(a)
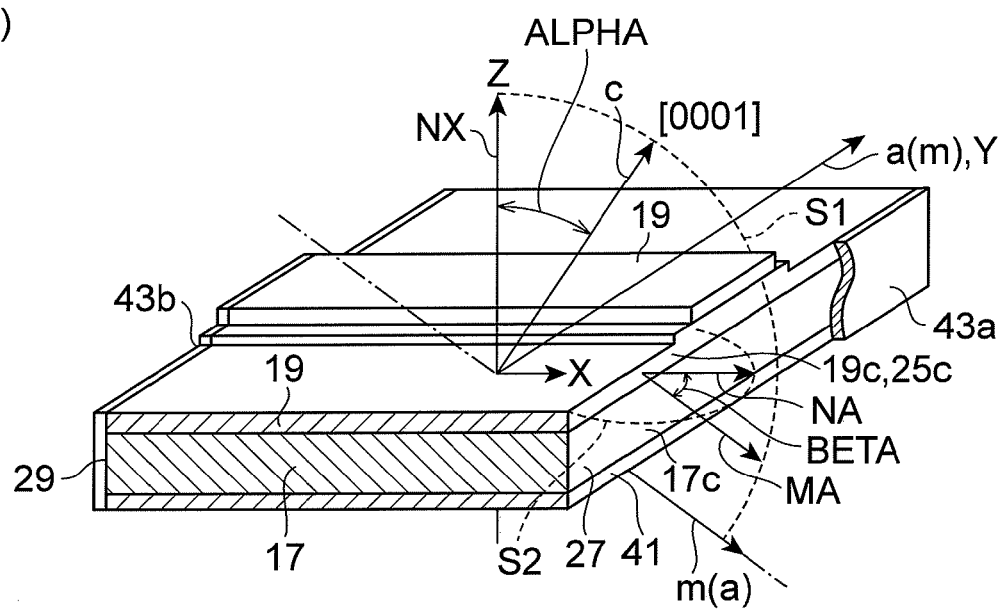
(b)
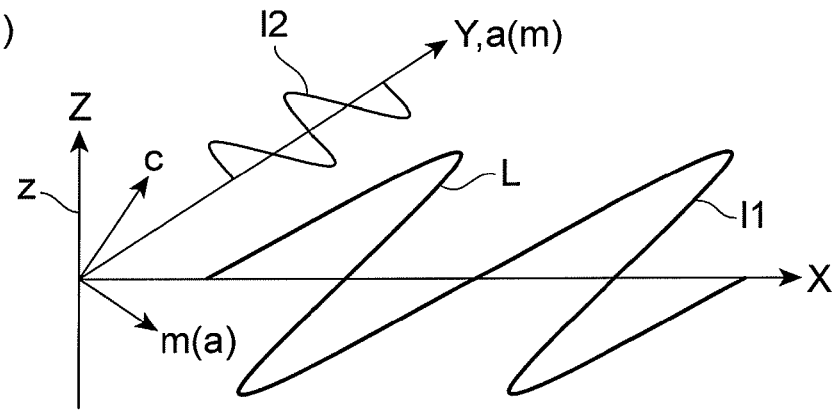

Fig.13
(a)
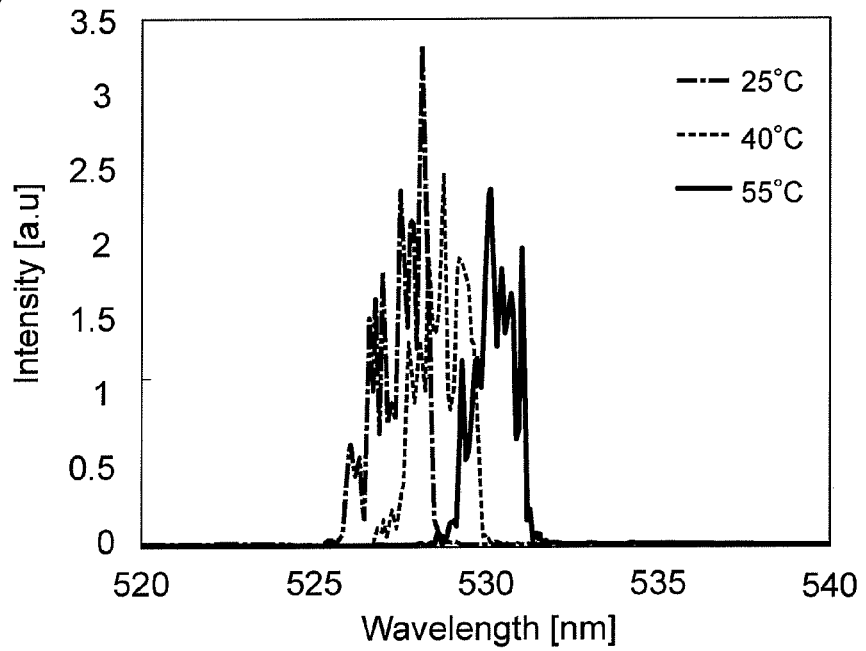
(b)
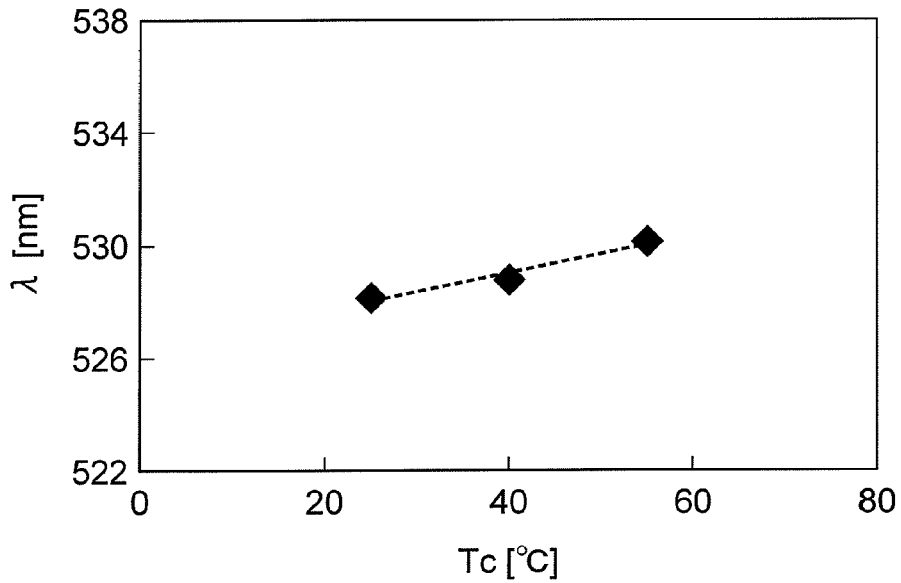

Fig.14
(a)
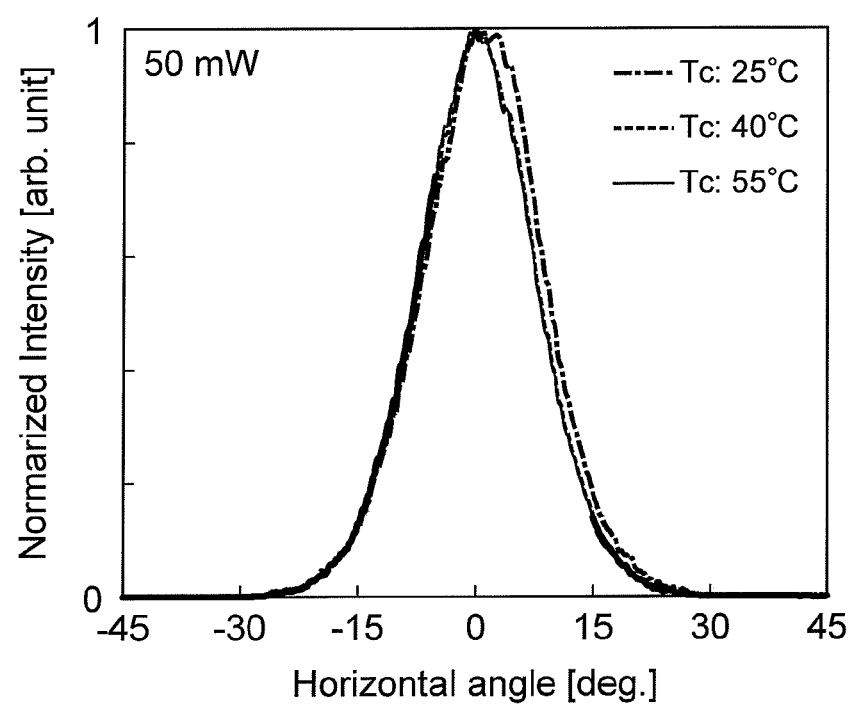
(b)
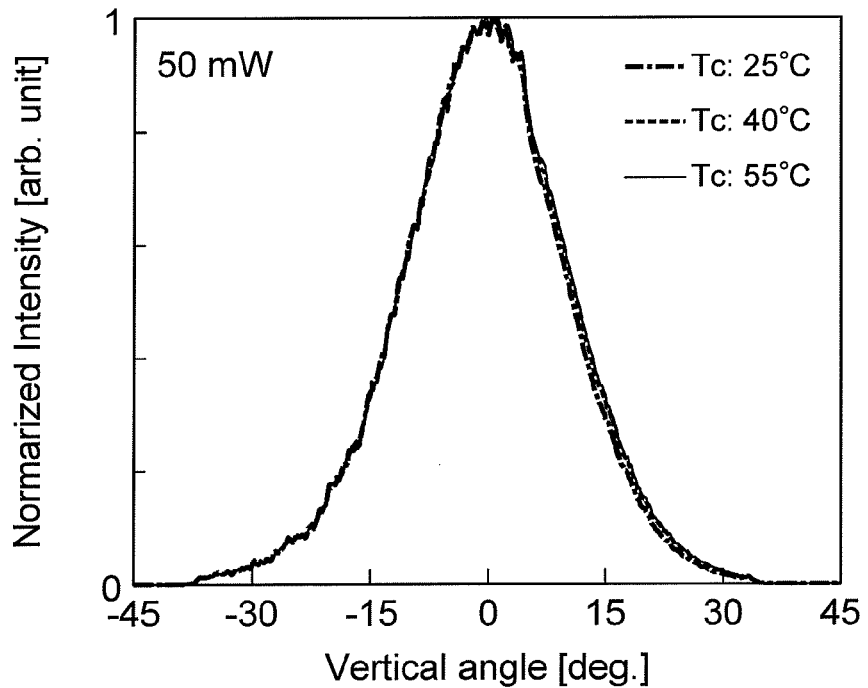

*Fig.16*
(a)
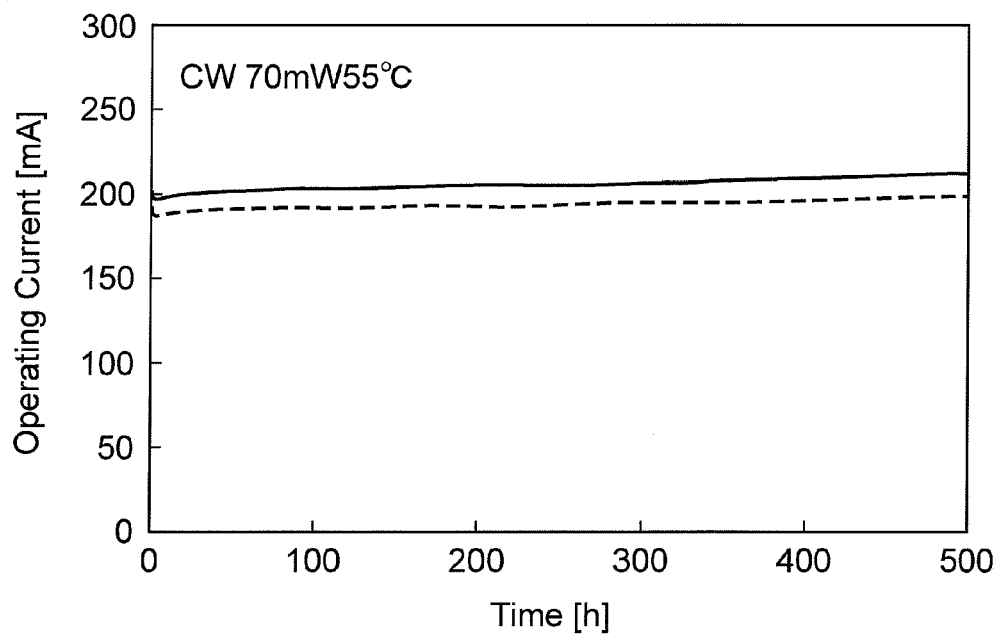
(b)
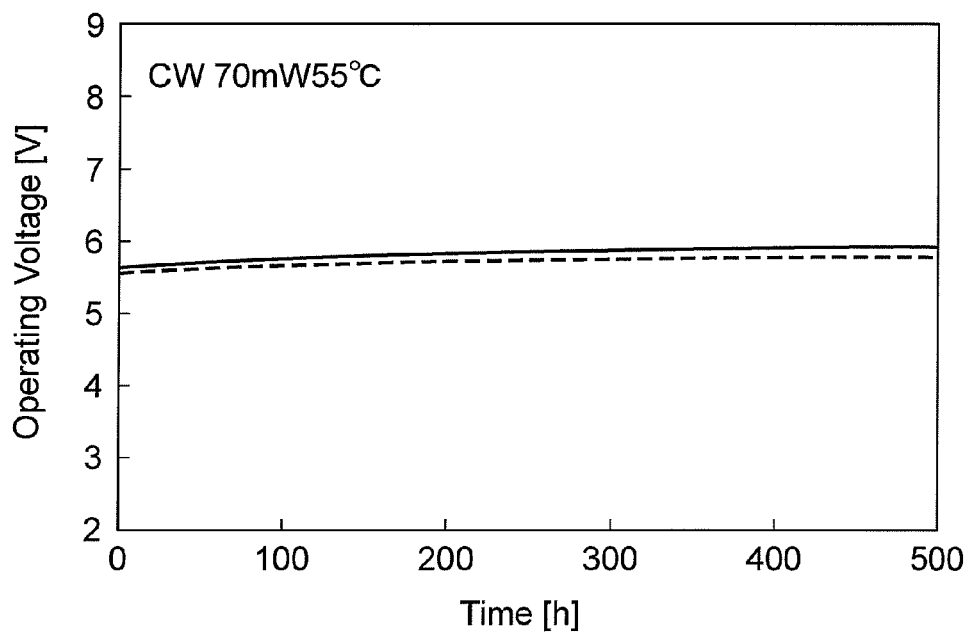

GROUP-III NITRIDE SEMICONDUCTOR LASER DEVICE

CROSS REFERENCE TO RELATED APPLICATIONS

This application is related to and claims priority under 35 U.S.C. 119 to U.S. a provisional patent application 61/649,109, filed May 18, 2012, entitled "Group III NITRIDE SEMICONDUCTOR LASER DEVICE," and a provisional patent application 61/668,925, filed Jul. 6, 2012, entitled "GREEN LASER DIODE," and incorporated by reference in their entirety.

BACKGROUND OF THE INVENTION

1. Field of the Invention

The present invention relates to a group-III nitride semiconductor laser device.

2. Related Background Art

Patent Literature 1 discloses a group-III nitride semiconductor light-emitting device.

Non-patent Literatures 1 to 3 disclose characteristics of semiconductor devices formed on a c-plane. Non-patent Literatures 4 and 5 disclose characteristics of semiconductor laser devices formed on a semipolar plane. Non-patent Literature 6 discloses lasing in an absolute temperature range of 161 to 246 K and optical emission in a wavelength range of 508 to 520 nm. Non-patent Literature 7 discloses lasing emission at a wavelength of 520 nm in which the reflectance of a front end face and the reflectance of a rear end face, which are formed by cleavage, are 97% and 99%, respectively, to achieve lasing.

Patent Literature 1: Japanese Unexamined Patent Application Publication No. 2011-077393

Non-patent Literature 1: S. Lutgen, D. Dini, I. Pietzonka, S. Tautz, A. Breidenassel, A. Lell, A. Avramescu, C. Eichler, T. Lermer, J. Muller, G. Bruederl, A. Gomez, U. Strauss, W. G. Scheibenzuber, U. T. Schwarz, B. Pasenow, and S. Koch: Proc. SPIE 7953 (2011) 79530G Non-patent Literature 2: T. Miyoshi, S. Masui, T. Okada, T. Yanamoto, T. Kozaki, S. Nagahama, and T. Mukai: Appl. Phys. Express 2 (2009) 062201

Non-patent Literature 3: T. Miyoshi, S. Masui, T. Okada, T. Yanamoto, T. Kozaki, S. Nagahama, and T. Mukai: Phys. Status Solidi A 207 (2010) 1389

Non-patent Literature 4: J. W. Raring, M. C. Schmidt, C. Poblenz, Y. Chang, M. J. Mondry, B. Li, J. Iveland, B. Walters, M. R. Krames, R. Craig, P. Rudy, J. S. Speck, S. P. DenBaars, and S. Nakamura: Appl. Phys. Express 3 (2010) 112101

Non-patent Literature 5: J. W. Raring: presented at ICNS9, 9th Int. Conf. Nitride Semiconductors, 2011

Non-patent Literature 6: D. Sizov, R. Bhat, K. Song, D. Allen, B. Paddock, S. Coleman, L. C. Hughes, and C. Zah: Appl. Phys. Express 4 (2011) 102103

Non-patent Literature 7: You-Da Lin, Shuichiro Yamamoto, Chia-Yen Huang, Chia-Lin Hsiung, Feng Wu, Kenji Fujito, Hiroaki Ohta, James S. Speck, Steven P. DenBaars, and Shuji Nakamura: Appl. Phys. Express 3 (2010) 082001

SUMMARY OF THE INVENTION

For example, Non-patent Literature 4 reports that using a group-III nitride semiconductor allows a long-wavelength lasing. An increase in the reflectance of an optical cavity facilitates lasing. Many studies have focused on improvement in properties, such as lasing, the amount of the threshold current required for lasing, and the level of optical power.

Such studies and developments have not focused on the reflectance of the laser cavities. Thus, the improvement in the properties mentioned above has presumably been achieved through values associated with the above-described properties.

Studies conducted by the inventors on group-III nitride semiconductor laser devices using semipolar planes have revealed that the quality and reflectance of the end faces in optical cavities probably relate to the reliability of the semiconductor devices and the linearity of the I-L characteristic curve. Under the circumstances of the above studies and developments, the complexity and difficulty of technology associated with group-III nitride semiconductor laser devices which use a semipolar planes have prevented the full understanding of technical matters to be improved to increase the performances of the group-III nitride semiconductor laser devices.

An object of one aspect of the present invention is to provide a group-III nitride semiconductor laser device that can reduce an operating current required to achieve a desired optical output.

A group-III nitride semiconductor laser device according to one aspect of the present invention comprises: (a) a laser structure comprising a support base which comprises a group-III nitride semiconductor and has a semipolar primary surface, and a semiconductor region provided on the semipolar primary surface of the support base; (b) a first reflective layer, which is provided on a first end face in the semiconductor region, for a lasing cavity of the group-III nitride semiconductor laser device; and (c) a second reflective layer, which is provided on a second end face in the semiconductor region, for the lasing cavity of the group-III nitride semiconductor laser device. The laser structure includes a laser waveguide extending along the semipolar primary surface of the support base; the semiconductor region includes an active layer; the active layer includes a gallium nitride-based semiconductor layer; a c+ axis vector indicating the direction of a <0001> axis of the group-III nitride semiconductor of the support base tilts at a tilt angle of 63 degrees or more and less than 80 degrees toward an m-axis of the group-III nitride semiconductor with respect to a normal vector indicating the direction of an axis normal to the semipolar primary surface; the reflectance of the first reflective layer is less than 60% within a wavelength range of 525 to 545 nm; and the reflectance of the second reflective layer is 85% or more within the wavelength range of 525 to 545 nm.

The first reflective layer of the lasing cavity of the group-III nitride semiconductor laser device has a reflectance of less than 60%, and the second reflective layer of the lasing cavity has a reflectance of 85% or more. Hence, an increase in the threshold current prevents degradation of the lasing characteristics and the occurrence of spatial unevenness in the photon density in the lasing cavity. If the reflectance of one of the end faces is excessively low, the threshold current increases significantly due to an increase in mirror loss. If the reflectance of both end faces is excessively high, the laser gain decreases due to spatial unevenness in the photon density in the lasing cavity. Such unevenness in the photon density (spatial hole burning) causes a kink to occur in the I-L characteristics, as well as reduces the wall-plug efficiency.

The group-III nitride semiconductor laser device according to the aspect of the present invention preferably further comprises a ridge structure.

The ridge structure of the group-III nitride semiconductor laser device controls the broadening of the current supplied to the active layer, the optical confinement in the longitudinal and transverse directions, and the interaction between the carriers and the light that propagates through the laser waveguide extending along the semipolar surface.

In the group-III nitride semiconductor laser device according to the aspect of the present invention, the semiconductor region preferably includes a contact layer of a group-III nitride and an optical guiding layer of a group-III nitride; the optical guiding layer is preferably provided between the active layer and the contact layer; and the height of the ridge structure preferably is large enough to include a part of the contact layer and a part of the optical guiding layer in the ridge structure.

In the group-III nitride semiconductor laser device, the height of the ridge structure guides the current supplied to the active layer to readily control the current broadening width within the active layer.

In the group-III nitride semiconductor laser device according to the aspect of the present invention, the reflectance of the first reflective layer is preferably 30% or more within a wavelength range of 525 to 545 nm.

In the group-III nitride semiconductor laser device according to the aspect of the present invention, the reflectance of the second reflective layer is preferably 99.9% or less within a wavelength range of 525 to 545 nm.

In the group-III nitride semiconductor laser device according to the aspect of the present invention, the reflectance of the first reflective layer is preferably 35% or more within a wavelength range of 525 to 545 nm. In the group-III nitride semiconductor laser device according to the aspect of the present invention, the reflectance of the first reflective layer is preferably 55% or less within a wavelength range of 525 to 545 nm. The reflectance of the first reflective layer is preferably 35% or more and 55% or less within such a wavelength range.

In the group-III nitride semiconductor laser device according to the aspect of the present invention, the reflectance of the first reflective layer may be 50% or less within a wavelength range of 525 to 545 nm. In the group-III nitride semiconductor laser device according to the aspect of the present invention, the reflectance of the first reflective layer may be 40% or more within a wavelength range of 525 to 545 nm. The reflectance of the first reflective layer is preferably 40% or more and 50% or less within such a wavelength range.

In the group-III nitride semiconductor laser device according to the aspect of the present invention, the tilt angle is preferably 70 degrees or more. In the group-III nitride semiconductor laser device according to the aspect of the present invention, the tilt angle is preferably less than 80 degrees. The tilt angle is preferably 70 degrees or more and less than 80 degrees.

In the group-III nitride semiconductor laser device according to the aspect of the present invention, the primary surface of the support base preferably tilts at an angle in the range of −4 to +4 from a {20-21} plane when the tilt angle taken with respect to the plane that is orthogonal to the c+ axis of the support base (hereinafter also referred to as "off angle") is 63 degrees or more and less than 80 degrees. The primary surface of the support base, which has an off angle of 45 degrees or more and less than 80 degrees or an off angle of 100 degrees or more and 145 degrees or less preferably, tilts at an angle in the range of −4 to +4 degrees with respect to one of the planes {10-11}, {20-21}, {20-2-1}, and {10-1-1}.

In the group-III nitride semiconductor laser device according to the aspect of the present invention, the primary surface of the support base preferably comprises a {20-21} plane.

In the group-III nitride semiconductor laser device according to the aspect of the present invention, the semipolar primary surface of the support base preferably comprises GaN. In the group-III nitride semiconductor laser device according to the aspect of the present invention, the support base preferably comprises a GaN substrate.

In the group-III nitride semiconductor laser device according to the aspect of the present invention, the first reflective layer preferably comprises a dielectric multilayer, and the second reflective layer preferably comprises a dielectric multilayer.

In the group-III nitride semiconductor laser device according to the aspect of the present invention, the support base preferably has a first substrate end face connected to the first end face in the semiconductor region; the first reflective layer preferably is provided over the first substrate end face; the support base preferably has a second substrate end face connected to the second end face in the semiconductor region; and the second reflective layer preferably is provided over the second substrate end face.

The support base of the group-III nitride semiconductor laser device may have a first substrate end face connected to the first end face in the semiconductor region, and a second substrate end face connected to the second end face in the semiconductor region. In this aspect, the flatness of the first and second reflective layers is improved.

The group-III nitride semiconductor laser device according to the aspect of the present invention may further comprise an electrode provided on the semiconductor region of the laser structure. The electrode preferably comprises a Pd electrode in contact with the upper surface of the semiconductor region.

In the group-III nitride semiconductor laser device according to the aspect of the present invention, the difference between the reflectance of the first reflective layer and the reflectance of the second reflective layer preferably exceeds 25%.

The difference in reflectance in the group-III nitride semiconductor laser device prevents the upper limit of the photon density from increasing in the lasing cavity.

In the group-III nitride semiconductor laser device according to the aspect of the present invention, the end faces of the support base and the end faces of the semiconductor region are preferably exposed at each of the first and the second end faces; and the angle formed between an end face of the active layer in the semiconductor region and the reference plane that is orthogonal to the m-axis of the support base comprising the hexagonal group-III nitride semiconductor is preferably within a range of (ALPHA−5) to (ALPHA+5) degrees on a first plane defined by the m-axis and a c-axis of the group-III nitride semiconductor.

The group-III nitride semiconductor laser device has an end face that satisfies perpendicularity in the angle that the c-axis and the m-axis form.

In the group-III nitride semiconductor laser device according to the aspect of the present invention, the angle may be within a range of −5 to +5 degrees on a second plane orthogonal to the first plane and the normal axis.

The group-III nitride semiconductor laser device has an end faces that satisfies the perpendicularity at an angle on a plane orthogonal to the normal axis of the semipolar surface.

The above-described object and other objects, features, and advantages of the present invention will be apparent from the detailed description of the embodiments of the present invention with reference to the accompanying drawings.

BRIEF DESCRIPTION OF THE DRAWINGS

FIG. 2 is a view showing the polarization of light from an active layer of the group-III nitride semiconductor laser device.

FIG. 13 is a view showing temperature dependence of the lasing peak wavelength and the lasing spectra of green laser diodes at 50 mW under CW operation in the range of 25 to 55 Celsius degrees at an optical power of 50 mW.

FIG. 14 is a view showing the lateral (θ-parallel) and vertical (θ-vertical) far-field patterns (FFPs) of a true green laser diode with the lasing wavelength of 528 nm and an output power of 50 mW under CW operation in the temperature range of 25 to 55 Celsius degrees.

FIG. 16 is a view showing lifetime test results of two 528.2-529.1 nm true green laser diodes in CW operation under APC condition at 55 Celsius degrees of case temperature.

EMBODIMENTS

Figure 1:
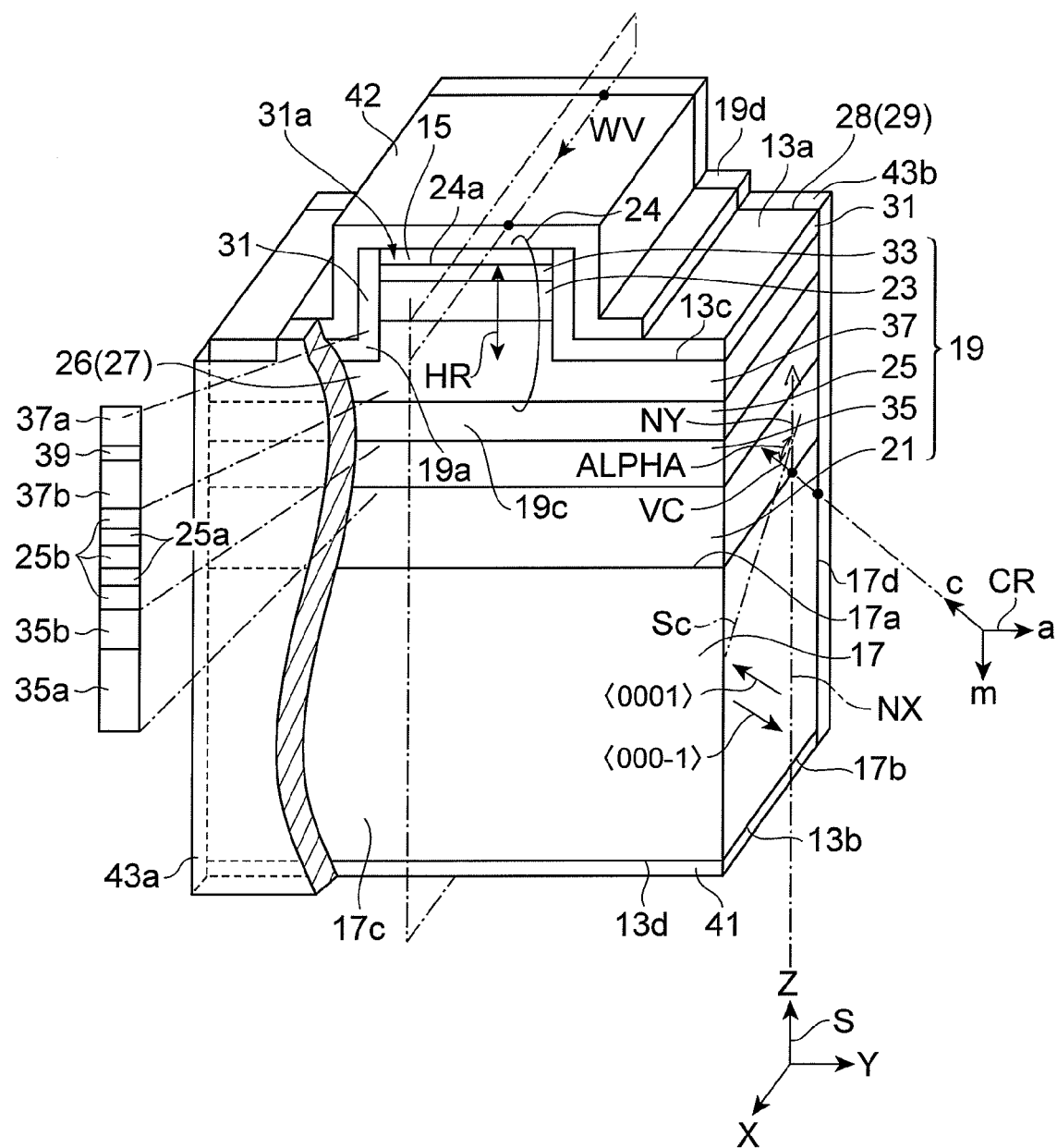
FIG. 1 is a schematic view of the structure of a group-III nitride semiconductor laser device according to an embodiment.

The teaching of the invention can be easily understood through the detailed description described below with reference to the accompanying exemplary drawings.

A group-III nitride semiconductor laser device and a method of fabricating a group-III nitride semiconductor laser device according to embodiments according to the present invention will now be described with reference to the accompanying drawings. The same component will be designated by the same reference numerals, when appropriate.

FIG. 1 is a schematic view showing the structure of a group-III nitride semiconductor laser device according to an embodiment of the present invention. The group-III nitride semiconductor laser device 11 includes a laser structure 13 and an ohmic electrode 15. The laser structure 13 includes a support base 17 and a semiconductor region 19. The support base 17 includes a semipolar primary surface 17a, which comprises a hexagonal group-III nitride semiconductor, and a back surface 17b. The semiconductor region 19 is provided over the semipolar primary surface 17a of the support base 17. The ohmic electrode 15 is provided on the semiconductor region 19 of the laser structure 13. The semiconductor region 19 includes an active layer 25 which includes a gallium nitride-based semiconductor layer.

FIG. 1 illustrates an orthogonal coordinate system S and a crystal coordinate system CR. The normal axis NX extends along the Z-axis in the orthogonal coordinate system S. The semipolar primary surface 17a extends parallel to a predetermined plane, which is defined by the X and Y axes of the orthogonal coordinate system S. FIG. 1 also illustrates a typical c-plane Sc. A c+ axis vector that indicates the direction of the <0001> axis of the group-III nitride semiconductor of the support base 17 tilts with respect to the normal vector NV, which represents the direction of the normal axis NX, toward a crystal axis of an m- and a-axes of the group-III nitride semiconductor. The tilt angle falls within the range of 45 to 80 degrees or 100 to 135 degrees. In this embodiment, the direction of the c+ axis is the same as the direction of the vector VC, whereas the direction of the <000-1> axis is opposite to the direction of the c+ axis vector. In the embodiment illustrated in FIG. 1, the c+ axis vector of the hexagonal group-III nitride semiconductor of the support base 17 tilts at an angle ALPHA taken in a direction from the normal axis NX toward the m-axis of the hexagonal group-III nitride semiconductor. The angle ALPHA preferably falls within the range of 63 to 80 degrees.

The laser structure 13 includes a first end face 26 and a second end face 28 for an optical cavity. The laser waveguide of the optical cavity extends along the semipolar primary surface 17a in a direction from the second end face 28 to the first end face 26. The waveguide vector WV indicates the direction from the second end face 28 to the first end face 26. The first and second end faces 26 and 28 of the laser structure 13 intersect the reference plane defined by the normal axis NX and the crystal axis (for example, the m-axis) of the hexagonal group-III nitride semiconductor. In FIG. 1, the first and second end faces 26 and 28 intersect the m-n plane defined by the normal axis NX and the m-axis of the hexagonal group-III nitride semiconductor.

The c+ axis vector indicating the direction of the <0001> axis of the group-III nitride semiconductor of the support base 17 tilts in a direction from the normal vector NV toward the crystal axis, e.g. the m-axis, of the group-III nitride semiconductor at a tilt angle falling within the range of 63 to 80 degrees. The semipolar plane at an angle within this range can provide a spatially uniformity in indium content of the group-III nitride semiconductor, and allows the growth of the group-III nitride semiconductor with a high indium content.

A first reflective layer 43a of the lasing cavity of the group-III nitride semiconductor laser device 11 is provided on a first end face 19c of the semiconductor region 19. A second reflective layer 43b of the lasing cavity of the group-III nitride semiconductor laser device 11 is provided on a second end face 19d of the semiconductor region 19. In the wavelength range of 525 to 545 nm, the reflectance of the first reflective layer 43a is less than 60%, and the reflectance of the second reflective layer 43b is 85% or more. When the light from the active layer 25 has a wavelength within the range of 525 to 545 nm, the reflectance of the first reflective layer 43a is smaller than the reflectance of the second reflective layer 43b.

In the group-III nitride semiconductor laser device 11, the first reflective layer 43a of the lasing cavity has a reflectance of less than 60%, and the second reflective layer 43b of the lasing cavity has a reflectance of 85% or more. This laser device can prevents degradation in the lasing characteristics due to an increase in the threshold current, and a spatial unevenness in the photon density in the lasing cavity. When the reflectance of one of the end faces 26 and 28 is excessively low, this low reflectance results in increase in mirror loss to causes an increase in the threshold current. When the reflectance of the end faces 26 and 28 is excessively high, this high reflectance causes spatial unevenness in the optical density in the lasing cavity, lowering the laser gain. The unevenness in the photon density (spatial hole burning) leads to not only the occurrence of a kink in the I-L characteristics but also a decrease in the wall-plug efficiency (WPE).

In the group-III nitride semiconductor laser device 11, the difference in the reflectance between the first reflective layer 43a and the second reflective layer 43b preferably exceeds 25%. This large difference in the reflectance prevents raise in the maximum optical density in the lasing cavity. The difference in the reflectance is preferably 70% or less. The difference in the reflectance is preferably 40% or more.

In the group-III nitride semiconductor laser device 11, the reflectance of the first reflective layer 43a is preferably 30% or more into the wavelength range of 525 to 545 nm. The reflectance of such a value controls the increase in the threshold current within a practical range. The reflectance of the second reflective layer 43b is preferably 99.9% or less within the wavelength range of 525 to 545 nm. The reflectance of such a value can reduce the mirror loss.

The reflectance of the first reflective layer 43a is more preferably 35% or more within the wavelength range of 525 to 545 nm. The reflectance of such a value enables the increase in the threshold current to fall within a practical range. The reflectance of the first reflective layer 43a is more preferably 55% or less within the wavelength range of 525 to 545 nm. The reflectance of such a value can prevent a kink from appearing in the I-L characteristics.

The reflectance of the first reflective layer 43a may be 50% or less within the wavelength range of 525 to 545 nm. The reflectance of such a value can further reduce the possibility of kinking in the I-L characteristics. The reflectance of the first reflective layer 43a may be 40% or more within the wavelength range of 525 to 545 nm. The reflectance of such a value can prevent a kink from occurring in the I-L characteristics while keeping the threshold current within a practical range.

Each of the first reflective layer 43a and the second reflective layer 43b may be composed of, for example, a dielectric multilayer. Hereinafter, the first reflective layer 43a and the second reflective layer 43b may also be referred to as "first dielectric multilayer 43a" and "second dielectric multilayer 43b," respectively.

The semiconductor region 19 includes a first cladding layer 21 and a second cladding layer 23. The active layer 25 is disposed between the first cladding layer 21 and the second cladding layer 23. The first cladding layer 21 is composed of a gallium nitride-based semiconductor of a first conductivity type, such as n-type AlGaN or n-type InAlGaN. The second cladding layer 23 is composed of a gallium nitride-based semiconductor of a second conductivity type, such as p-type AlGaN or p-type InAlGaN. The active layer 25 has gallium nitride-based semiconductor layers, for example, a well layer 25a. The active layer 25 also includes a barrier layer 25b composed of gallium nitride-based semiconductors. The well layers 25a and the barrier layers 25b are alternately arranged along the z-axis direction, and the uppermost barrier layer and/or the lowermost layer may be omitted. The well layers 25a are composed of, for example, InGaN, and the barrier layers 25b are composed of, for example, GaN or InGaN. The active layer 25 may have a quantum well structure that emits light of a wavelength within the range of 360 to 600 nm. The semipolar surface makes the active layer 25 suitable for the generation of light having a wavelength within the range of 500 to 550 nm. The first cladding layer 21, the second cladding layer 23, and the active layer 25 are arrayed along the axis NX normal to the semipolar primary surface 17a. The normal axis NX extends along the direction of the normal vector NV. The c-axis Cx of the group-III nitride semiconductor of the support base 17 extends along the direction of the c-axis vector VC.

The group-III nitride semiconductor laser device 11 further includes an insulating layer 31. The insulating layer 31 covers the front surface 19a of the semiconductor region 19 of the laser structure 13. The semiconductor region 19 is provided between the insulating layer 31 and the support base 17. The support base 17 comprises a hexagonal group-III nitride semiconductor. The insulating layer 31 has an opening 31a. The opening 31a may have a stripe shape. In the structure in which the-axis tilts toward the m-axis as in this embodiment, the opening 31a extends along a line of intersection at which the m-n plane and the front surface 19a of the semiconductor region 19 intersect with each other. The intersection line extends in the direction of the waveguide vector WV.

The ohmic electrode 15 is in contact with the front surface 19a of the semiconductor region 19 (for example, a second conductivity type contact layer 33) through the opening 31a and extends in the direction of the intersection line. The laser waveguide of the group-III nitride semiconductor laser device 11 includes the first cladding layer 21, the second cladding layer 23, and the active layer 25 and extends in the direction of the intersecting line.

The group-III nitride semiconductor laser device 11 preferably has a ridge structure. The electrode 15 is in contact with the upper surface 24a of the ridge structure 24. The ridge structure 24 controls the width of distribution of current supplied to the active layer 25, the optical confinement, and the interaction between the carriers and the light that propagates through the laser waveguide.

In the group-III nitride semiconductor laser device 11, the semiconductor region 19 includes the contact layer 33 of a group-III nitride and an optical guiding layer 37 of a group-III nitride. The optical guiding layer 37 is provided between the active layer 25 and the contact layer 33 and accordingly between the active layer 25 and the second cladding layer 23. The ridge structure 24 preferably has a height HR that permits the ridge structure 24 to include the contact layer 33, the second cladding layer 23, and a part of the optical guiding layer 37 therein. The height HR of the ridge structure 24 guides current supplied to the active layer 25 to readily control the width of current broadening in the active layer 25.

Another electrode 41 is provided over the back surface 17b of the support base 17. The electrode 41, for example, covers the back surface 17b of the support base 17. The group-III nitride semiconductor laser device 11 may further include a pad electrode 42, which is provided on the ohmic electrode 15. The pad electrode 42 may comprise, for example, gold. The ohmic electrode 15 is in contact with the upper surface 19a of the semiconductor region 19 and preferably, includes, for example, a Pd electrode.

In the group-III nitride semiconductor laser device 11, the support base 17 includes a first substrate end face 17c. The first substrate end face 17c connects the first end face 19c of the semiconductor region 19. The first reflective layer 43a is provided over the first substrate end face 17c. The support base 17 has a second substrate end face 17d. The second substrate end face 17d connects the second end face 19d of the semiconductor region 19. The second reflective layer 43b is provided over the second substrate end face 17d. In this embodiment, the first reflective layer 43a extends continuously from the first end face 19c of the semiconductor region 19 to the first substrate end face 17c, and the second reflective layer 43b extends continuously from the second end face 19d to the second substrate end face 17d.

In the group-III nitride semiconductor laser device 11, the first end face 26 and the second end face 28 may be fractured faces. Hereinafter, the first end face 26 and the second end face 28 are also referred to as "first fractured face 27" and "second fractured face 29," respectively. The first fractured face 27 and the second fractured face 29 intersect the m-n plane that are defined by the normal axis NX and the m-axis of the hexagonal group-III nitride semiconductor. The laser cavity of the group-III nitride semiconductor laser device 11 includes the first and second fractured faces 27 and 29. The laser waveguide extends between the first fractured face 27 and the second fractured face 29. The laser structure 13 has a first face 13a and a second face 13b, which is opposite to the first face 13a. The first and second fractured faces 27 and 29 extend from the edge 13c of the first surface 13a to the edge 13d of the second surface 13b. The first and second fractured faces 27 and 29 differ from known cleaved surfaces, such as the c-plane, m-plane, and a-plane.

In the group-III nitride semiconductor laser device 11, the first and second fractured faces 27 and 29, which constitute the laser cavity, intersect the m-n plane. Thus, the laser waveguide extends in the direction of the line defined as an intersection of the m-n plane and the semipolar primary surface 17a. Thus, the group-III nitride semiconductor laser device 11 includes a laser cavity which achieves a low threshold current.

The optical waveguide structure of the group-III nitride semiconductor laser device 11 will now be described below. The group-III nitride semiconductor laser device 11 includes an n-side optical guiding layer 35 and a p-side optical guiding layer 37. The n-side optical guiding layer 35 includes a first portion 35a and a second portion 35b. The n-side optical guiding layer 35 is composed of, for example, GaN or InGaN. The p-side optical guiding layer 37 includes a first portion 37a and a second portion 37b. The p-side optical guiding layer 37 is composed of, for example, GaN or InGaN. A carrier blocking layer 39 is provided, for example, between the first portion 37a and the second portion 37b.

Figure 3:
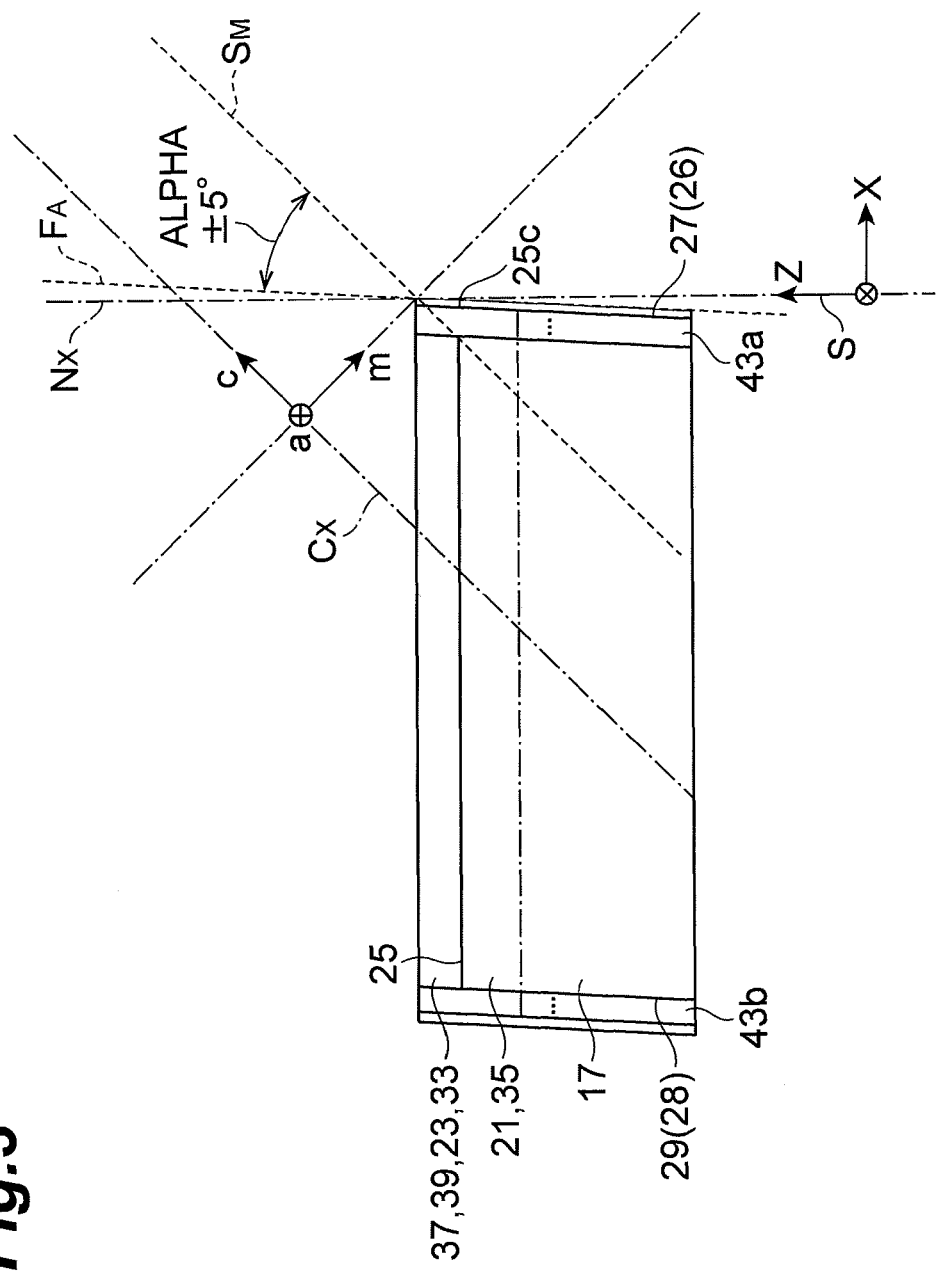
FIG. 3 is a schematic view of a cross-section defined by a c-axis and an m-axis.

FIG. 2 illustrates the polarization of the light in the active layer 25 of the group-III nitride semiconductor laser device 11. FIG. 3 schematically shows a cross-sectional view taken along a plane defined by the c-axis and the m-axis. As illustrated in FIG. 2, the dielectric multilayer 43a is disposed over the first fractured face 27, and the dielectric multilayer 43b is disposed over the second fractured face 29. The dielectric multilayers 43a and 43b may be composed of, for example, at least one of silicon oxides, silicon nitrides, silicon oxynitrides, titanium oxides, titanium nitrides, titanium oxynitrides, zirconium oxides, zirconium nitrides, zirconium oxynitrides, zirconium fluorides, tantalum oxides, tantalum nitrides, tantalum oxynitrides, hafnium oxides, hafnium nitrides, hafnium oxynitrides, hafnium fluorides, aluminum oxides, aluminum nitrides, aluminum oxynitrides, magnesium fluorides, magnesium oxides, magnesium nitrides, magnesium oxynitrides, calcium fluorides, barium fluorides, cerium fluorides, antimony oxides, bismuth oxides, and gadolinium oxides. In the group-III nitride semiconductor laser device 11, a practical dielectric layer may be composed of at least one of silicon oxides (for example, $SiO_2$), silicon nitrides (for example, $Si_3N_4$), silicon oxynitrides (for example, $SiO_xN_{1-x}$), titanium oxides (for example, $TiO_2$), titanium nitrides (for example, TiN), titanium oxynitrides (for example, $TiO_xN_{1-x}$), zirconium oxides (for example, $ZrO_2$), zirconium nitrides (for example, ZrN), zirconium oxynitrides (for example, $ZrO_xN_{1-x}$), zirconium fluorides ($ZrF_4$), tantalum oxides (for example, $Ta_2O_5$), tantalum nitrides ($Ta_3N_5$), tantalum oxynitrides ($TaO_xN_{1-x}$), hafnium oxides (for example, $HfO_2$), hafnium nitrides (for example, HfN), hafnium oxynitrides (for example, $HfO_xN_{1-x}$), hafnium fluorides (for example, $HfF_4$), aluminum oxides (for example, $Al_2O_3$), aluminum nitrides (for example, AlN), aluminum oxynitrides ($AlO_xN_{1-x}$), magnesium fluorides (for example, $MgF_2$), magnesium oxides (for example, MgO), magnesium nitrides (for example $Mg_3N_2$), magnesium oxynitrides (for example, $MgO_xN_{1-x}$), calcium fluorides (for example, $CaF_2$), barium fluorides (for example, $BaF_2$), cerium fluorides (for example, $CeF_3$), antimony oxides (for example, $Sb_2O_3$), bismuth oxides (for example, $Bi_2O_3$), and gadolinium oxides (for example, $Gd_2O_3$). At least one of these materials can be applied to the end faces 27 and 29 as end face coating. Such end face coating enables the control of the reflectance.

As illustrated in Part (b) of FIG. 2, a laser beam L from the active layer 25 of the laser waveguide oriented in the direction of the crystal axis, as shown in the present embodiment, is polarized in the direction of the a-axis of the hexagonal group-III nitride semiconductor. In the group-III nitride semiconductor laser device 11, emission from the band-to-band transition that achieves a low threshold current is polarized. The fractured faces 27 and 29 of the laser cavity differ from known cleaved surfaces, such as the c-plane, m-plane, and a-plane. The fractured faces 27 and 29 have flatness and perpendicularity sufficient for mirrors of the cavity. Thus, the fractured faces 27 and 29 and the laser waveguide, which extends from one of the fractured faces 27 and 29 to the other, enables a low-threshold lasing by use of light of the optical component I1 generated by a band-to-band transition that is stronger than an optical component I2 polarized in the direction of the projected c-axis onto the primary surface, as illustrated in Part (b) of FIG. 2.

In the group-III nitride semiconductor laser device 11, the end face 17c of the support base 17 and the end face 19c of the semiconductor region 19 are exposed at the first fractured face 27. The end face 17c and the end face 19c are covered with the first dielectric multilayer 43a. The angle BETA formed between the m-axis vector MA of the active layer 25 and the normal vector NA of the end face 25c of the active layer 25 is defined by the component $(BETA)_1$ on the first plane S1 and the component $(BETA)_2$ on the second plane S2, where the component $(BETA)_1$ is defined on the first plane S1 defined by the c-axis and the m-axis of the group-III nitride semiconductor and the component $(BETA)_2$ is defined on the second plane S2 orthogonal to the first plane S1 and the normal axis NX. The component $(BETA)_1$ is preferably in the range of (ALPHA−5) to (ALPHA+5) degrees on the first plane S1 defined by the c-axis and the m-axis of the group-III nitride semiconductor. This range of angle is illustrated in FIG. 3 as the angle that a typical m-plane SM and a reference plane FA form. In FIG. 3, the typical m-plane SM extends from the inside to the outside of the laser structure for an illustrative purpose. The reference plane FA extends along the end face 25c of the active layer 25. The group-III nitride semiconductor laser device 11 has an end face that satisfies the above-described perpendicularity associated with the angle BETA defined by direction of rotation from one of the c-axis and the m-axis to the other. The component $(BETA)_2$ is preferably within the range of −4 to +4 degrees on the second plane S2. The following equation holds: $BETA^2 = (BETA)_1^2 + (BETA)_2^2$. The end faces 27 and 29 of the group-III nitride semiconductor laser device 11 satisfy the above-described perpendicularity associated with an angle on a plane orthogonal to the normal axis NX of the semipolar primary surface 17a.

Referring back to FIG. 1, the support base 17 of the group-III nitride semiconductor laser device 11 has a thickness of 400 μm or less, preferably. Such a thickness is preferable for forming high-quality fractured faces for the laser cavity of the group-III nitride semiconductor laser device 11. It is more preferable that the support base 17 of the group-III nitride semiconductor laser device 11 have a thickness within the range of 50 to 100 μm. Such a thickness is more preferable for fabricating high-quality fractured faces for the laser cavity of the group-III nitride semiconductor laser device 11. This improves handling and enhances the yield.

In the group-III nitride semiconductor laser device 11, the angle defined by the normal axis NX and the c-axis of the hexagonal group-III nitride semiconductor is preferably 45 degrees or more and 80 degrees or less. This angle is preferably 100 degrees or more and 135 degrees or less. At an angle of less than 45 degrees and more than 135 degree, the m-plane may appear on the end face produced by pressing. An angle that is more than 80 degrees and less than 100 degrees cannot provide the end face with desired flatness and perpendicularity. When the off angle is in the range of 45 degrees or more and less than 80 degrees or of 100 degrees or more and 145 degrees or less, it is preferable that the primary surface of the support base have a crystal orientation which tilts at an angle within the range of −4 to +4 degrees with respect to one of the planes {10-11}, {20-21}, {20-2-1}, and {10-1-1}. When the off angle is in the range of 45 degrees or more and less than 80 degrees or of 100 degrees or more and 145 degrees or less, it is preferable that the primary surface of the support base have a crystal orientation of one of the planes {10-11}, {20-21}, {20-2-1}, and {10-1-1}.

From the viewpoint of the formation of fractured faces, it is preferable that the angle ALPHA defined by the normal axis NX and the c-axis of the hexagonal group-III nitride semiconductor be 63 degrees or more and 80 degrees or less in the group-III nitride semiconductor laser device 11. It is also preferable that the angle ALPHA be 100 degrees or more and 117 degrees or less. At an angle of less than 63 degrees and more than 117 degrees, the m-plane may appear in a part of the end face formed by pressing. An angle of more than 80 degrees and less than 100 degrees may not achieve the desired flatness and perpendicularity.

In the group-III nitride semiconductor laser device 11, when the c-axis of the group-III nitride semiconductor tilts toward the m-axis of the nitride semiconductor, the practical plane orientation and the angle include at least one of the following ranges: for example, the primary surface 17a of the support base 17 preferably may tilt at an angle in the range of −4 to +4 degrees with respect to the {20-21} plane when the tilt angle is in the range of 63 degrees or more and less than 80 degrees; and the primary surface 17a of the support base 17 may be {20-21} plane.

In the group-III nitride semiconductor laser device 11, it is preferable that the tilt angle ALPHA be 70 degrees or more. If the tilt angle ALPHA exceeding 70 degrees can suppress the occurrence of non-homogeneity in the indium content of the active layer, thereby achieving excellent light-emitting characteristics. It is preferable that the tilt angle ALPHA be less than 80 degrees. The tilt angle ALPHA exceeding 80 degrees can reduce the efficiency of indium incorporation, causing difficulties in obtaining a long wavelength emission.

The support base 17 may be composed of one of GaN, AlN, AlGaN, InGaN, and InAlGaN. A substrate composed of such a gallium nitride-based semiconductor provides the fractured faces 27 and 29, which can be used as a cavity.

The primary surface 17a of the support base 17 may be composed of GaN, and the support base 17 may be composed of GaN. The group-III nitride semiconductor laser device that is provided with a laser structure formed by use of such a GaN primary surface can generate light, for example, in the above wavelength range (blue to green light). An AlN or AlGaN substrate increases the degree of polarization, and enhances the optical confinement due to a low refractive index. An InGaN substrate reduces lattice mismatch between the substrate and the light-emitting layer, enhancing the crystal quality. In the group-III nitride semiconductor laser device 11, the density of stacking faults in the support base 17 may be $1 \times 10^4$ $cm^{-1}$ or less. A stacking fault density of $1 \times 10^4$ $cm^{-1}$ or less can effectively prevent the occurrence of reductions in the flatness and/or perpendicularity of the fractured faces.

Figure 4:
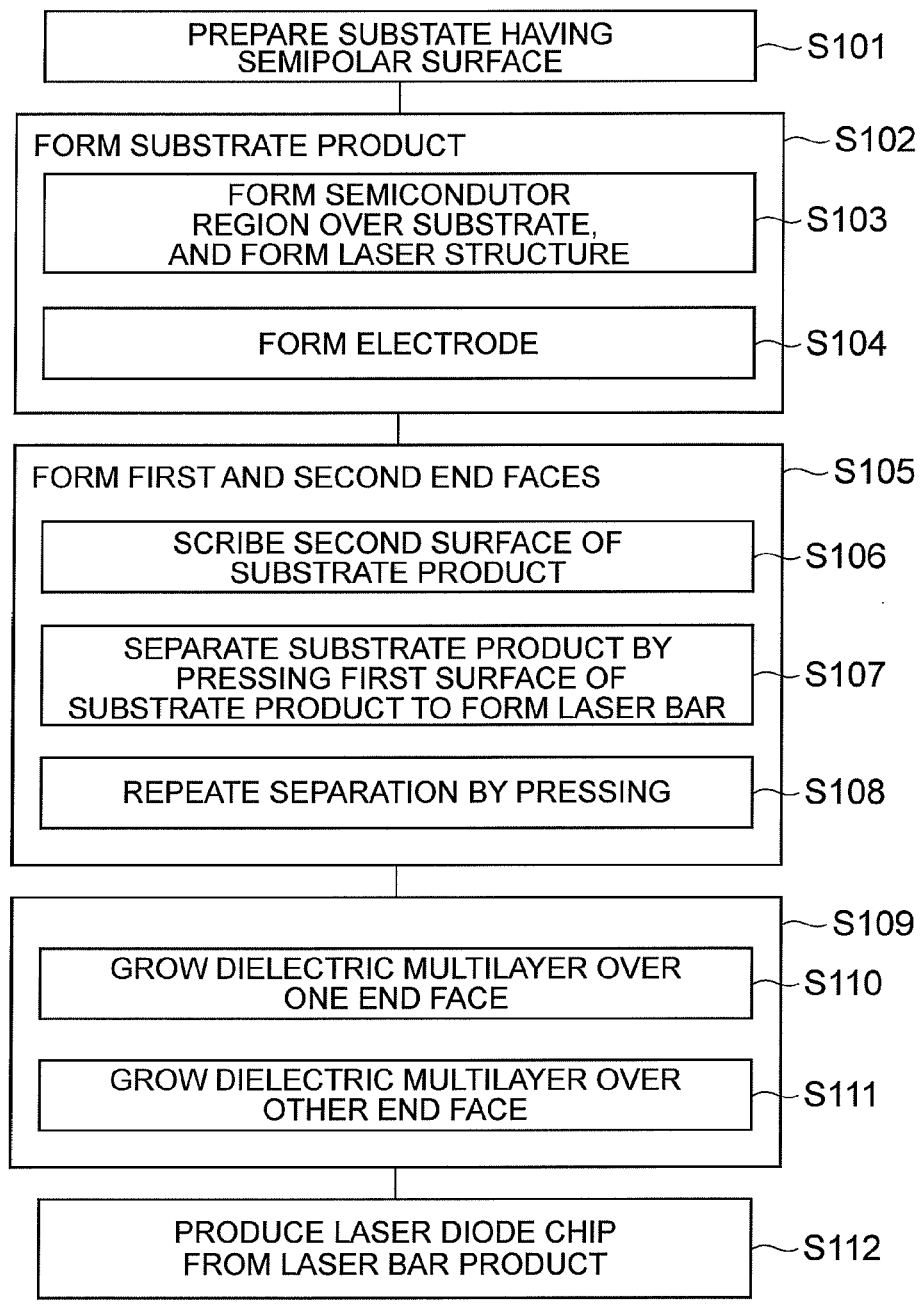
FIG. 4 is a view illustrating the major steps in a method of fabricating a group-III nitride semiconductor laser device according to an embodiment.

FIG. 4 illustrates the major steps of a method of fabricating the group-III nitride semiconductor laser device according to this embodiment. Part (a) of FIG. 5A illustrates a substrate 51. In the present embodiment, the c-axis of the substrate 51 tilts toward the m-axis. In Step S101, the substrate 51 is prepared for production of the group-III nitride semiconductor laser device. The c-axis (vector VC) of the hexagonal group-III nitride semiconductor of the substrate 51 tilts by a non-zero angle ALPHA with respect to the normal axis NX away from the normal axis NX toward the m-axis (vector VM) of the hexagonal group-III nitride semiconductor. Thus, the substrate 51 has a semipolar primary surface 51a composed of the hexagonal group-III nitride semiconductor.

Figure 5:
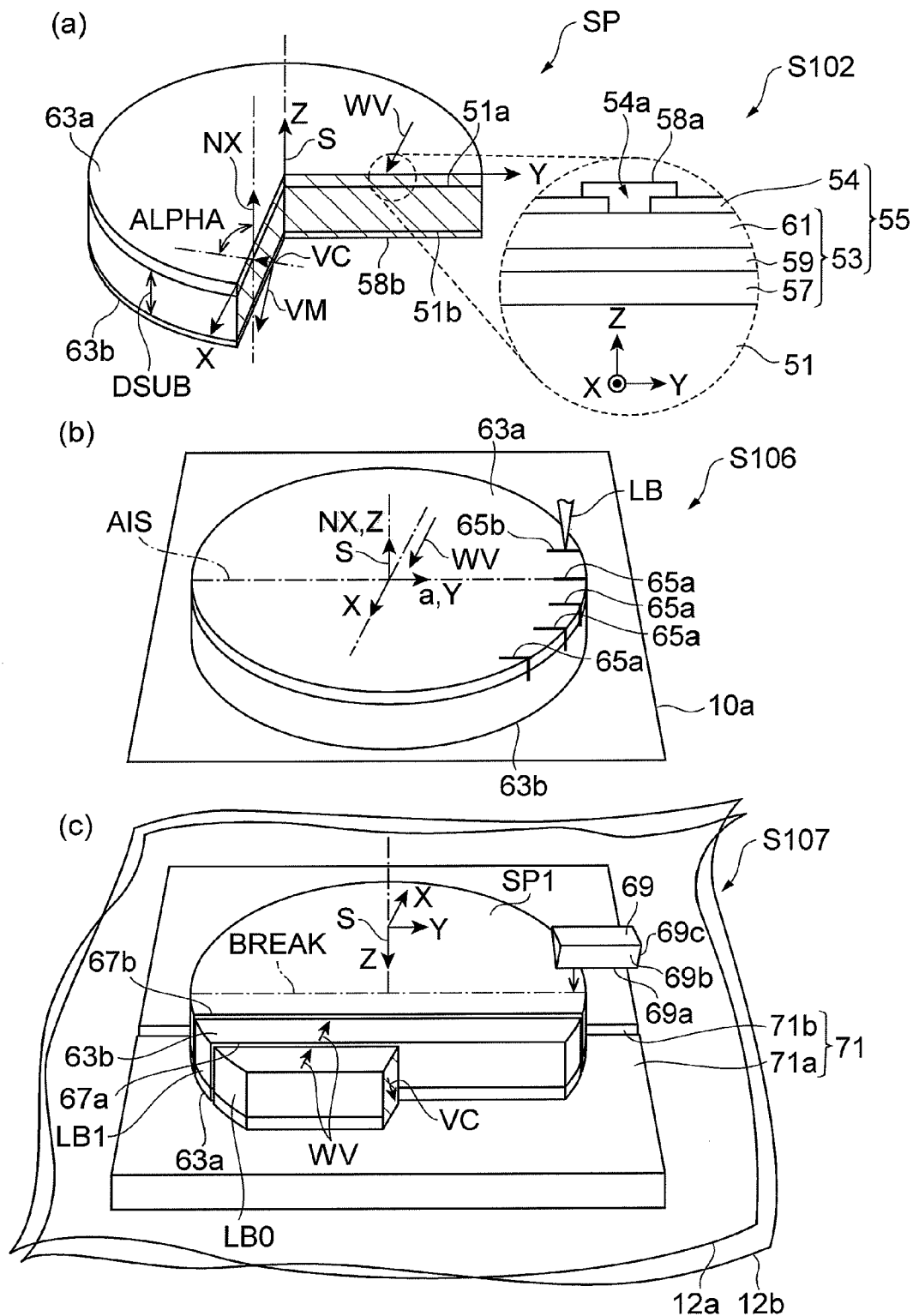
FIG. 5 is a schematic view illustrating the major steps in a method of fabricating a group-III nitride semiconductor laser device according to an embodiment.

In Step S102, a substrate product SP is produced. The substrate product SP is shown as a substantially circular member in Part (a) of FIG. 5, and the shape of the substrate product SP, however, is not limited thereto. The preparation of the substrate product SP begins by the formation of a laser structure 55 in Step S103. The laser structure 55 includes a semiconductor region 53 and the substrate 51. In Step S103, the semiconductor region 53 is grown over the primary surface 51a. The semiconductor region 53 is formed by forming a first conductivity type gallium nitride-based semiconductor region 57, a light-emitting layer 59, and a second conductivity type gallium nitride-based semiconductor region 61 in sequence on the semipolar primary surface 51a. The gallium nitride-based semiconductor region 57 includes, for example, an n-type cladding layer, and the gallium nitride-based semiconductor region 61 includes, for example, a p-type cladding layer. The light-emitting layer 59 is provided between the gallium nitride-based semiconductor region 57 and the gallium nitride-based semiconductor region 61, and may include an active layer, an optical guiding layer, and en electron blocking layer. The gallium nitride-based semiconductor region 57, the light-emitting layer 59, and the second conductivity type gallium nitride-based semiconductor region 61 are arranged along the normal axis NX of the primary surface 51a. The semiconductor layers are epitaxially grown on the primary surface 51a. The semiconductor region 53 is covered with an insulating layer 54. The insulating layer 54 is composed of, for example, silicon oxide. The insulating layer 54 has an opening 54a. The opening 54a may have a stripe shape. Part (a) of FIG. 5 illustrates the waveguide vector WV, which extends parallel to the m-n plane in this embodiment. If required, a ridge structure may be formed in the semiconductor region 53 before formation of the insulating layer 54; a ridge structure may be formed in the semiconductor region 53 together with the insulating layer 54; or a ridge structure may be formed in the semiconductor region 53 together with the insulating layer 54 and an electrode. A ridge structure formed in this way may include the gallium nitride-based semiconductor region 61 which is formed to become a ridge shape.

In Step S104, an anode 58a and a cathode 58b are provided on the laser structure 55. Before providing an electrode on the back side of the substrate 51, the back side of the substrate used for crystal growth is polished to form the substrate product SP having a desired thickness DSUB. For example, the anode 58a is provided over the semiconductor region 53, and the cathode 58b is provided on the back surface (polished surface) 51b of the substrate 51. The anode 58a extends along the direction of the X-axis, and the cathode 58b covers the entire back surface 51b. The substrate product SP been formed through these steps. The substrate product SP includes a first surface 63a and a second surface 63b, and the second surface 63b is located at the opposite side of the first surface 63a. The semiconductor region 53 is provided between the first surface 63a and the substrate 51.

In Step S105, the end faces for the laser cavity are formed. In this embodiment, laser bars are produced from the substrate product SP. A laser bar has a pair of end faces on which dielectric multilayers can be deposited. An exemplary process of producing a laser bar and its end faces will now be described.

As shown in Part (b) of FIG. 5, in Step S106, the first surface 63a of the substrate product SP is scribed. The scribing can be carried out using a laser scriber 10a. Scribe grooves 65a are formed in the scribing process. Referring to Part (b) of FIG. 5, five scribe grooves 65a has been already formed and a scribe groove 65b is now being formed with a laser beam LB. The length of the scribing grooves 65a is shorter than that of the line of intersection AIS between the first surface 63a and the a-n plane which is defined by the a-axis and the normal axis NX of the hexagonal group-III nitride semiconductor. Part of the line of intersection AIS is irradiated with the laser beam LB. The first surface 63a is irradiated with the laser beam LB to form grooves on the first surface 63a so as to extend in a particular direction and reach the substrate. The scribe grooves 65a may be formed at, for example, an edge of the substrate product SP.

In Step S107, the second surface 63b of the substrate product SP, which is sandwiched between sheets 12a and 12b, is pressed to separate the substrate product SP into a substrate product SP1 and a laser bar LB1, as illustrated in Part (c) of FIG. 5. The pressing is performed with a breaking tool, such as a blade 69. The blade 69 has an edge 69a extending in one direction and at least two blade faces 69b and 69c, which define the edge 69a at which the blade faces 69b and 69c meet. The substrate product SP1 placed on a support device 71 and is pressed thereon. The support device 71 has a support face 71a and a depression 71b that extends in one direction. The depression 71b is formed on the support face 71a. Regarding the orientation and location, one of the scribe grooves 65a in the substrate product SP1 are aligned with the extending direction of the depression 71b on the support device 71, so that the substrate product SP1 is positioned to the depression 71b. The edge of the breaking tool is aligned with the depression 71b, and then the edge of the breaking tool is pressed against the substrate product SP1 in a direction of a plane intersecting with the second surface 63b. Preferably, the angle of the above intersection is substantially orthogonal to the second surface 63b. The substrate product SP1 is separated into a remaining substrate product SP1 and a laser bar LB1. The laser bar LB1 created by press has first and second end faces 67a and 67b. At least a part of each of the respective edge faces of the light-emitting layer that appear at the end faces 67a and 67b is provided with the perpendicularity and flatness that are sufficient for the cavity mirror of a semiconductor laser device.

The first and second end faces 67a and 67b of the laser bar LB1 extend from the first surface 63a to the second surface 63b. Thus, the end faces 67a and 67b constitute a laser cavity of the group-III nitride semiconductor laser device and intersect the XZ plane. The XZ plane corresponds to the m-n plane defined by the normal axis NX and the m-axis of the hexagonal group-III nitride semiconductor. The waveguide vectors WV are depicted on the laser bars LB0 and LB1. The waveguide vectors WV are directed from the end face 67a toward the end face 67b. Part (c) of FIG. 5 is a partially broken view showing a part of the laser bar LB0 in order to indicate the direction of the c-axis vector VC. The waveguide vectors WV intersect the c-axis vector VC to form an acute angle.

Through this procedure, the first surface 63a of the substrate product SP is scribed along the a-axis of the hexagonal group-III nitride semiconductor, and then the second surface 63b of the substrate product SP is pressed to separate the substrate product SP into a remaining substrate product SP1 and a laser bar LB1. Thus, the first and second end faces 67a and 67b of the laser bar LB1 intersect the m-n plane. Through such end face formation, the end faces 67a and 67b are provided with flatness and perpendicularity sufficient for constituting a laser cavity of the group-III nitride semiconductor laser device. The resulting laser waveguide extends in the direction of the projected c-axis of the hexagonal group-III nitride semiconductor. This procedure enables the formation of a cavity mirror including end faces that can provide a laser waveguide.

The above procedure can form a remaining substrate product SP1 and a laser bar LB1 from the substrate product SP1 by fracture. In Step S108, multiple laser bars are produced by repetition of the separation by press. The fracture of the substrate product SP1 is caused at a scribe groove 65a, which is shorter than the fracture line BREAK defined on the laser bar LB1.

In Step S109, dielectric multilayers are deposited on the respective end faces 67a and 67b of the laser bar LB1 to form a laser bar product. This procedure is carried out as follows, for example. In Step S110, a dielectric multilayer is grown on one of the end faces 67a and 67b of the laser bar LB1. In Step S111, a dielectric multilayer is grown on the other one of the end faces 67a and 67b of the laser bar LB1. If the reflectance of the dielectric multilayer at the front is lower than the reflectance of the dielectric multilayer at the rear, a large amount of the laser light is emitted through the front dielectric multilayer, whereas a large amount of the laser light is reflected at the rear dielectric multilayer.

In Step S112, the laser bar product is separated into a number of semiconductor laser chips.

In the production method according to the present embodiment, the tilt angle of the primary surface may be within the range of 45 to 80 degrees or 100 to 135 degrees. When the tilt angle is less than 45 degrees and more than 135 degree, the end face produced by pressing is likely to become m-plane. When the tilt angle is more than 80 degrees and less than 100 degrees, the end face produced by pressing may not have desired flatness and perpendicularity. Preferably, the angle ALPHA is within the range of 63 to 80 degrees or 100 to 117 degrees. When the tilt angle is less than 45 degrees and more than 135 degrees, part of the end face formed by pressing is likely to become m-plane. When the tilt angle is more than 80 degrees and less than 100 degrees, the end face formed by pressing may not have desired flatness and perpendicularity. On the typical semipolar surfaces described above, end faces for a laser cavity can be provided, which has the flatness and perpendicularity sufficient for constituting a laser cavity of the group-III nitride semiconductor laser device.

The substrate 51 may be composed of one of GaN, AlN, AlGaN, InGaN, and InAlGaN. A substrate comprising such a gallium nitride-based semiconductor provides end faces that can be used as a laser cavity. The substrate 51 is preferably composed of GaN.

In Step S102 for producing the substrate product SP, the semiconductor substrate that has used for crystal growth is processed, for example, sliced or polished, so as to have a thickness of 400 µm or less, for example, so that the second surface 63b comprises a processed surface formed by polishing. The substrate having such a thickness can provide fractured faces with flatness and perpendicularity sufficient for constituting a laser cavity of the group-III nitride semiconductor laser device with good yield. The end faces 67a and 67b are formed without any ion damage as a result of the fracture. Preferably, the second surface 63b is a polished surface formed by polishing. A substrate product SP that has a thickness of preferably 50 µm or more enables easy handling thereof. Instead of fracturing, the end faces 67a and 67b may be formed by, for example, etching. An end face of the light-emitting layer is exposed at the face formed by etching.

In the method of producing a laser end face according to the present embodiment, an angle BETA, which is described above with reference to Part (a) of FIG. 2, can be also defined in the laser bar LB1. In the laser bar LB1, the component (BETA)$_1$ of the angle BETA is preferably within the range of (ALPHA−5) to (ALPHA+5) degrees on the first plane defined by the c-axis and the m-axis of the group-III nitride semiconductor (corresponding to the first plane S1 described with reference to Part (a) of FIG. 2). The component of angle BETA, which is taken in the direction from one of the c-axis and the m-axis to the other, satisfies the above-described perpendicularity on the end faces 67a and 67b of the laser bar LB1. The component (BETA)$_2$ of the angle BETA is preferably within the range of −5 to +5 degrees on the second plane (corresponding to the second plane S2 described with reference to Part (a) of FIG. 2). The component of angle BETA, which is defined on a plane orthogonal to the normal axis NX of the primary surface 51a, satisfies the above-described perpendicularity on the end faces 67a and 67b of the laser bar LB1.

The end faces 67a and 67b are formed by break caused by pressing the multiple gallium nitride semiconductor layers epitaxially grown over the primary surface 51a. Since the epitaxial layers are grown over the primary surface 51a, the end faces 67a and 67b are not cleavage faces of low plane indices, such as the c-plane, m-plane, and a-plane, which have been used as cavity mirrors in the past. The end faces 67a and 67b formed by breaking the laminate of epitaxial layers formed on the primary surface 51a has flatness and perpendicularity sufficient to work as cavity mirrors.

EXAMPLE 1

A laser diode is prepared through metal organic chemical vapor deposition, which will be described below. The materials used are as follows: trimethyl gallium (TMGa); trimethyl aluminum (TMAl), trimethyl indium (TMIn); ammonium (NH$_3$); silane (SiH$_4$); and bis(cyclopentadienyl) magnesium (Cp$_2$Mg). A {20-21} GaN substrate is provided as a substrate 71. The GaN substrate can be cut out from a thick (0001) GaN ingot, grown by HYPE with a wafer slicing apparatus at an angle of 75 degrees toward the m-axis.

Figure 6:
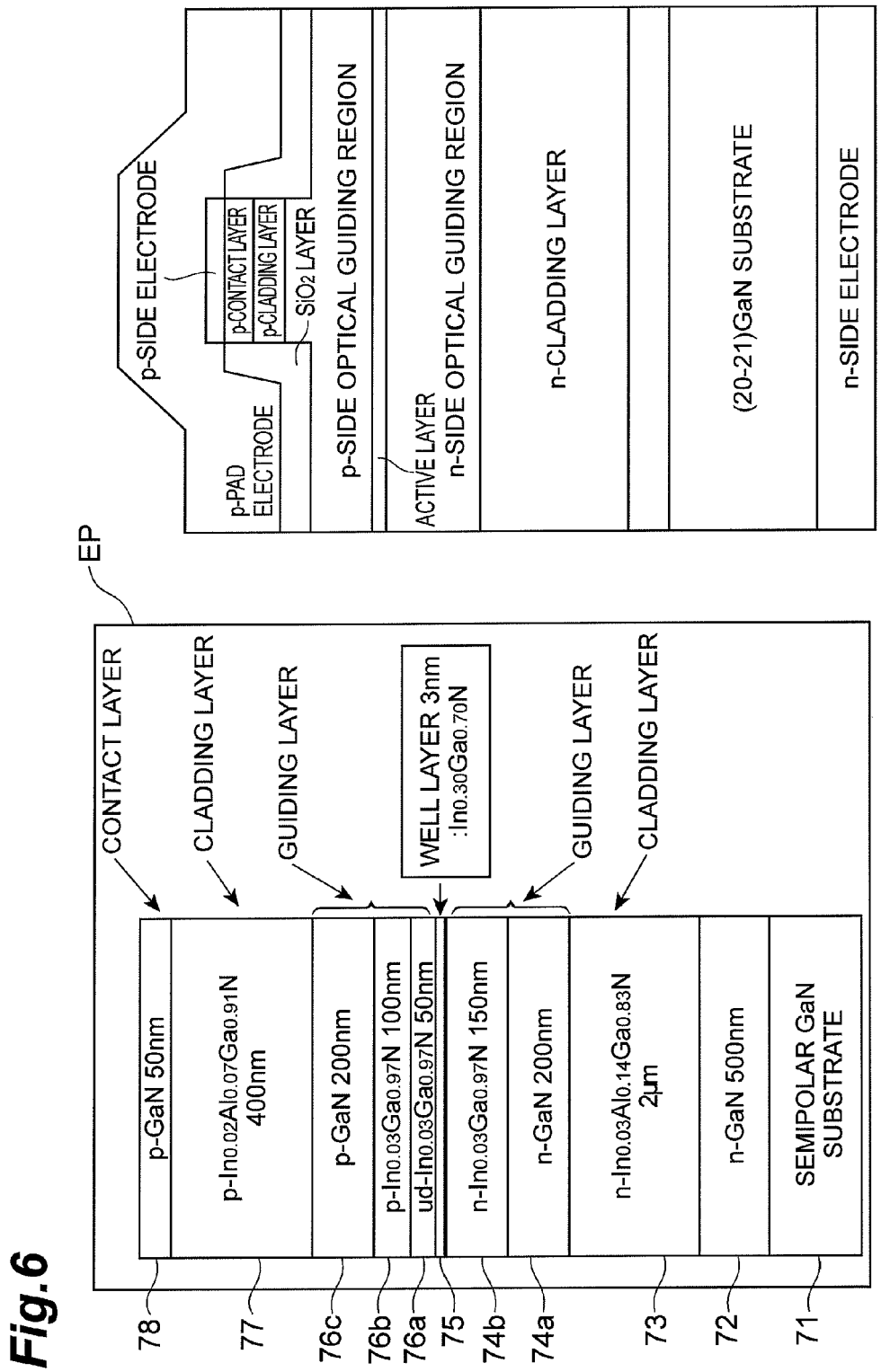
FIG. 6 is a view illustrating the structure of a group-III nitride semiconductor laser device and an epitaxial wafer according to an embodiment.

The substrate is placed on a susceptor in a reactor, and epitaxial layers for the laser structure, which is shown in FIG. 6, are grown through the following procedures. After placing the substrate 71 in the reactor, an n-type GaN layer 72 (a thickness of 500 nm) is grown on the substrate 71. Then, an n-type cladding layer 73 (for example, In$_{0.03}$Al$_{0.14}$Ga$_{0.83}$N and having a thickness of 2000 nm) is grown on the n-type GaN layer 72. Subsequently, a light-emitting layer is grown thereon. In this growth, first, an n-type optical guiding layer 74a (for example, GaN with a thickness of 200 nm) and an undoped optical guiding layer 74b (for example, In$_{0.03}$Ga$_{0.97}$N with a thickness of 150 nm) are grown over the n-type cladding layer 73. Next, an active layer 75 is grown thereon. The active layer 75 is composed of In$_{0.30}$Ga$_{0.70}$N (a thickness of 3 nm). Then, an undoped optical guiding layer 76a (for example, In$_{0.03}$Ga$_{0.97}$N with a thickness of 50 nm), a p-type optical guiding layer 76b (for example, In$_{0.03}$Ga$_{0.97}$N with a thickness of 100 nm), and a p-type optical guiding layer 76c (for example, GaN with a thickness of 200 nm) are grown over the active layer 75. Then, a p-type cladding layer 77 (for example, In$_{0.02}$Al$_{0.07}$Ga$_{0.91}$N and/or AlGaN with a thickness of 400 nm) is grown over the light-emitting layer. Finally, a p-type contact layer 78 (for example, GaN with a thickness of 50 nm) is grown over the p-type cladding layer 77. The epitaxial growth of these layers provides an epitaxial substrate EP.

A ridge structure is formed in the epitaxial substrate EP by photolithography and etching. First, a strip mask is formed by photolithography. The mask has a pattern extending in the direction of the c-axis projected onto the primary surface. The mask is used in a dry etching step to form a ridge structure shaped in a strip with the width of 2 µm. For example, chlorine gas (Cl$_2$) is used for dry etching. An insulating layer 79 is grown over the surface of the ridge structure. SiO$_2$ formed by, for example, vacuum-deposition is used as the insulating layer 79. After forming the insulating layer 79, a p-side electrode 80a and an n-side electrode 80b are formed to fabricate a substrate product. The p-side electrode 80a is formed by vacuum deposition. The p-side electrode 80a is composed of, for example, Ni/Au. The backside of this epitaxial substrate is polished to a thickness of 100 µm. Diamond slurry is used for polishing the backside. The n-side electrode 80b is formed over the polished surface. The n-side electrode 80b is composed of Ti/Al/Ti/Au.

A laser scriber that can emit a YAG laser beam of a wavelength of 355 nm is used to produce a laser bar from the substrate product by scribing. Scribe grooves are formed by directly irradiating the epitaxial surface of the substrate with a laser beam through an opening of the insulating layer at a pitch of 400 µm. The length of the cavity is 500 µm. A cavity mirror is formed by fracturing with a blade. A laser bar is produced by breaking caused by pressing the backside of the substrate product. The length of the cavity is preferably within the range of, for example, 400 to 1000 µm.

Then, end face coating is formed. The end face coating comprises a dielectric multilayer composed of a stack of a silicon oxide layer (for example, SiO$_2$) and a tantalum oxide layer (for example, Ta$_2$O$_5$). A dielectric multilayer of 2.3 pairs is grown on the front emission face as an end face coating. This dielectric multilayer has a reflectance of 54%. A dielectric multilayer of 6.5 pairs is grown on the rear emission face. This dielectric multilayer has a reflectance of 98%. In addition to the above, other dielectric multilayers with various reflectance values are formed as the end face coatings in combination.

In this experiments, the inventors study the reflectance of the emission end face of the end face coatings. In the study, various reflectance values are achieved in the range of a reflectance of 86% of a reflective layer to a reflectance of no end face coating. This study shows that the group-III nitride semiconductor laser device of an emission face with a reflectance of 45% achieves a slope efficiency four times better than that of an emission face with a reflectance of 86%, which leads to high optical output and excellent efficiency. The results of the experiments suggest that the reflectance of the front emission face is preferably 30% or more and less than 60%. More preferably, the reflectance of the front emission face is 35% or more and less than 55%.

Prior art and experiments conducted in the past have not provided reliable experimental data on reflectance in various studies due to the quality of base devices on which the reflective layers defining the reflectance are formed. According to the present embodiments, the green lasers on the semipolar plane have stable characteristics and can be applied to long-term experiments. Such stability enables the collection of data on the characteristics associated with the quality test and the reflectance of the end faces that affect (cause kink) the reliability and linearity of the I-L curve.

Based on such highly reliable data associated with the reflectance of the end face coating, the operating current (Top) required for achieving high optical output can be reduced. An emission face with a high reflectance causes an increase in the photon density at the end face, and when an optical output raises in response to an application of a large current, catastrophic optical damage (COD) of the end face may occur. Even if COD does not occur at the end face, spatial hole burning occurs due to a local decrease in carriers caused by increase in the photon density in the waveguide. The spatial hole burning causes a temporally decrease in the laser gain, which is observed as kink in the I-L characteristics. Thus, an excessively high reflectance is not desirable for the emission face. In contrast, an excessively low reflectance of the emission face causes an increase in mirror loss, which leads to an increase in the threshold current. Comprehensively, the inventors can demonstrate the end-face quality allowing the determination of a reflectance of the end face coating for a green laser on the semipolar plane.

EXAMPLE 2

An InGaN green laser diode with output powers of over 100 mW in the green spectral region beyond 530 nm is fabricated on semipolar {20-21} GaN substrates. Continuous-wave operation of the InGaN green laser diode is demonstrated. Wall plug efficiencies (WPEs) as high as 7.0-8.9% are realized in the wavelength range of 525-532 nm, which exceed those reported for c-plane laser diodes. The difference in the WPEs between the c-plane orientation and the semipolar plane orientation is found to become larger with increasing wavelength. These results suggest that the InGaN green laser diodes on the {20-21} plane with small piezoelectric fields and high compositional homogeneity are better suited as light sources for applications requiring wavelengths over 525 nm.

InGaN-based green laser diodes are expected to be the light sources in mobile full-color laser projectors. Although green lasers based on SHG technologies are already available, semiconductor laser diodes have advantages in size, stability and efficiency for commercial application. To meet the requirements of laser projection, more than 50 mW output power and 4.5% wall plug efficiency (WPE) are considered to be necessary with lasing wavelength over 515 nm, preferably over 525 nm in terms of a wide field of applications. Active R&D efforts have been focused on obtaining these properties both on polar c-plane, and on non-polar or semi-polar plane GaN substrates. Non-Patent Literature 1 reports a 522 nm green laser diodes with more than 80 mW output power and 6% WPE using c-plane GaN substrates. Further expansion of the wavelength over 525 nm is believed to be difficult because technical issues such as large piezoelectric fields and the In compositional fluctuations in the InGaN quantum wells are pronounced with an increase in the In contents, especially on the c-plane.

The Inventors have demonstrated semipolar {20-21} plane InGaN green laser diodes with exceptionally lower threshold current densities in the spectral region between 520-530 nm in comparison with those of conventional c-plane laser diodes. Adding to the weaker piezoelectric polarization and the resulting higher optical transition probability in the InGaN quantum wells, the {20-21} plane is found to have an advantage in the growth of homogeneous InGaN quantum wells, as shown by the uniform micro photoluminescence (PL) image and the small carrier localization energy. These features are beneficial for fabricating green laser diodes, and the longest lasing wavelength has reached 536.6 nm under continuous wave operation in our previous work, making the green laser diode on this plane an attractive light source for applications demanding longer wavelengths as well as higher output power.

Green laser diodes on {20-21} GaN substrates with output powers of over 100 mW in the wavelength range beyond 530 nm are described below. The different dependence of the WPE on the lasing wavelength between {20-21} plane and c-plane is discussed in terms of the luminescence properties and crystalline quality of In-rich InGaN QWs.

The semipolar {20-21} plane GaN substrates are produced by hydride vapor phase epitaxy (HYPE). Threading dislocation densities of the substrates are less than $1 \times 10^6$ cm$^{-2}$. The substrates exhibit n-type conductivity and the resistivity is sufficiently low (approximately 0.01 Ωcm) to form ohmic contacts on the back surface of the substrates. The laser diode structures are grown by metal organic chemical vapor deposition (MOCVD). An n-type GaN layer is grown directly on the GaN substrate, followed by an n-type InAlGaN cladding layer, an n-type InGaN waveguiding layer, an InGaN multiple QW (MQW) active region, a p-type InGaN waveguiding layer, a p-type InAlGaN cladding layer and a p-type GaN contact layer. A ridge waveguide of 2 μm in width was fabricated by conventional dry-etching and photolithography techniques. A p-type electrode is evaporated on the p-type contact layer, and an n-type electrode was formed on the backside of the wafer. The laser stripe was formed along [−1014] due to the advantageous orientation for the semipolar {20-21} laser diodes. The 500 μm long cavities and mirror facets are formed. Both facets are coated with dielectric mirrors to control the facet reflectivity.

Figure 7:
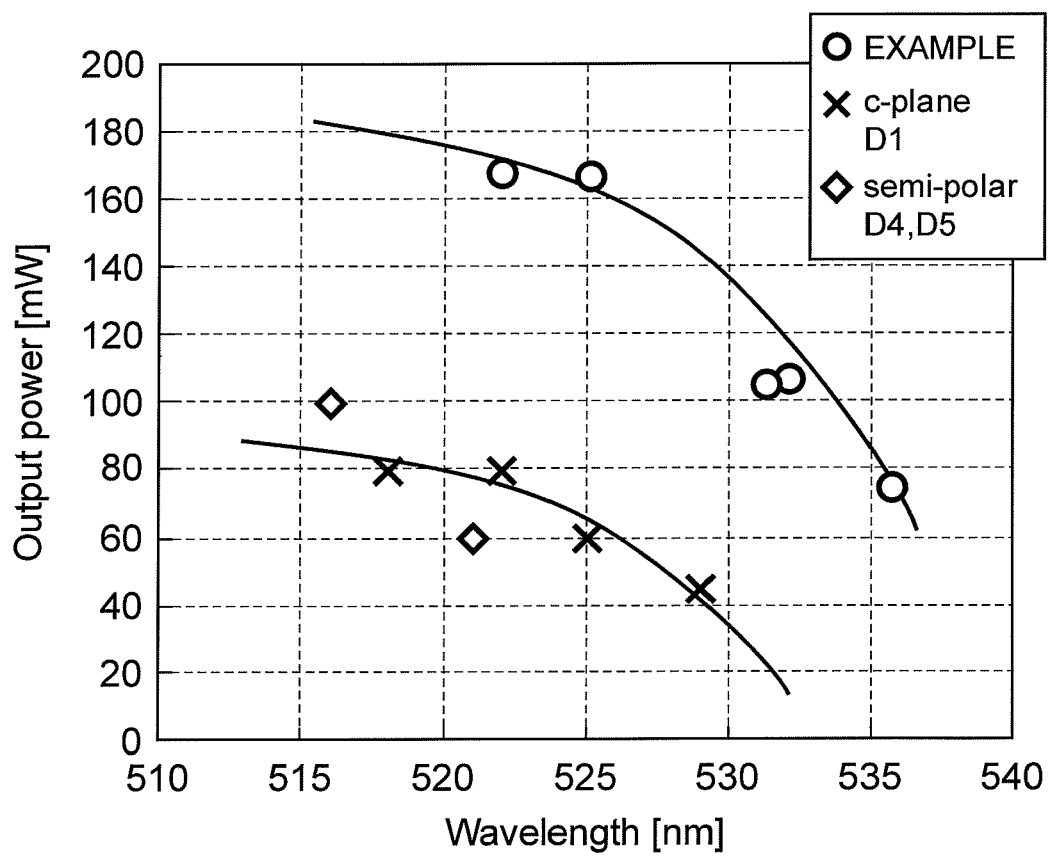
FIG. 7 is a view showing dependence of output power upon lasing wavelength of InGaN green laser diodes on different plane GaN substrates.

FIG. 7 shows the output power of green laser diodes from the Inventors' works. The green laser diodes on the {20-21} surface exhibit output powers of over 100 mW in the spectral region beyond 530 nm. The output powers under continuous wave operation (cw operation) at room temperature (RT) are as follows:
Optical power (mW), wavelength (nm)
168 mW, 522.0 nm;
167 mW, 525.1 nm;
105 mW, 531.3 nm;
107 mW, 532.1 nm;
75 mW, 535.6 nm.
FIG. 7 shows six circles, and values of c-plane laser diodes are disclosed in Non-patent Literature 1 (D1), Non-patent Literature 2 (D2) and Non-patent Literature 3 (D3). In FIG. 7, data disclosed in Non-patent Literature 1 (D1) are expressed by the cross marks. The other data for laser diodes on the semipolar are disclosed in Non-patent Literature 4 (D4) and Non-patent Literature 5 (D5), and are expressed by the diamond marks in FIG. 7. In the inventors' previous work, they report exceptionally lower threshold current densities in comparison to the c-plane laser diodes in the green spectral region of 520-530 nm. However, the slope efficiencies needed to be improved. In the present works, the inventors have studied the cavity length and the mirror reflectivity, and have made a fourfold improvement in the slope efficiency while suppressing the increase of the threshold current density. This improvement of the slope efficiency has led to the remarkable progress on the maximum output power.

Figure 8:
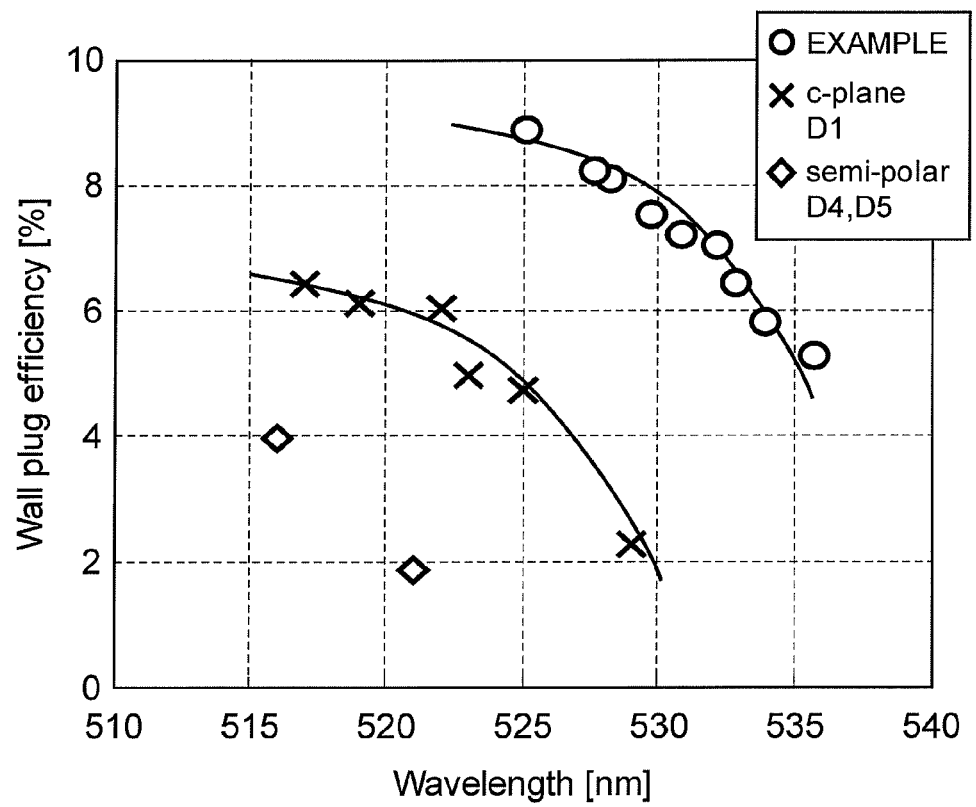
FIG. 8 is a view showing dependence of wall plug efficiency upon lasing wavelength of InGaN green laser diodes on different plane GaN substrates.

FIG. 8 shows the WPEs of semipolar {20-21} and c-plane green laser diodes. In the green spectral region, these laser diodes on the {20-21} plane clearly exhibit higher WPEs. In particular, the difference in the WPE between two crystal orientations is found to increase with increasing wavelength. The reason for this difference may be due to the higher compositional homogeneity of In-rich InGaN quantum wells (QWs) on the {20-21} plane, as well as the weaker piezoelectric fields.

Figure 9:
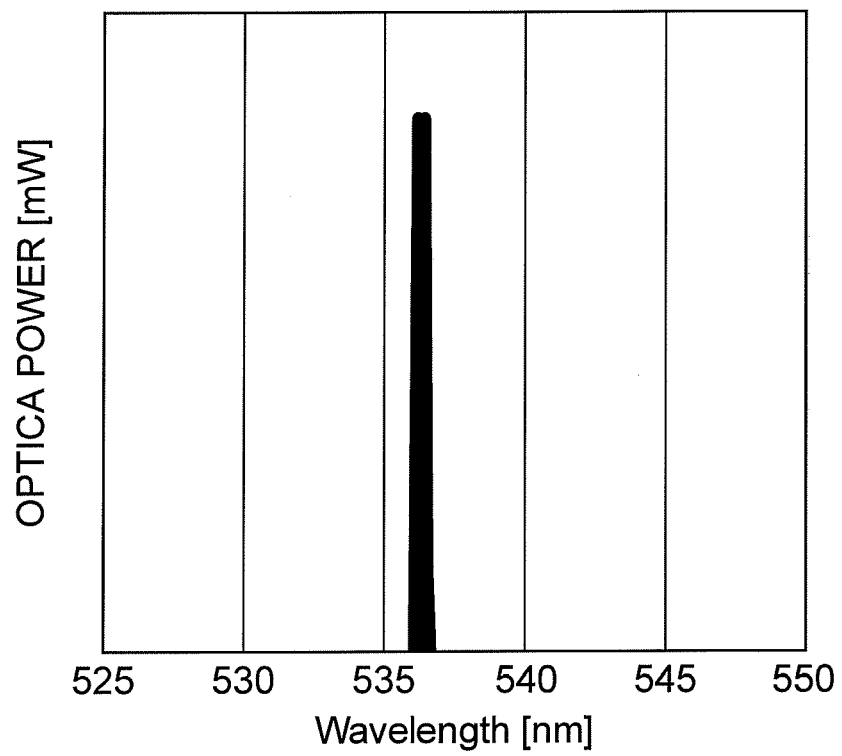
FIG. 9 is a view showing a lasing spectrum of a {20-21} laser diode in CW operation at room temperature.

As discussed in the inventors' works, the narrow electroluminescence (EL) line width, uniform microscopic PL image, and abrupt interfaces of quantum wells (QWs) have indicated the homogeneity of InGaN quantum wells (QWs) on the {20-21} plane. This is supported by other experimental results obtained by time-resolved photoluminescence (TRPL) measurements. The experimental results in the present examples indicate that the deterioration of the crystalline quality of the InGaN quantum wells (QWs) with increasing In composition is inhibited by fabricating the InGaN quantum wells (QWs) on the {20-21} plane. In addition, the improvement of the WPE has resulted in continuous wave (CW) lasing wavelengths as long as 536.5 nm as shown in FIG. 9. This is the longest lasing wavelength among all InGaN laser diodes to the best of the inventors' knowledge.

Figure 10:
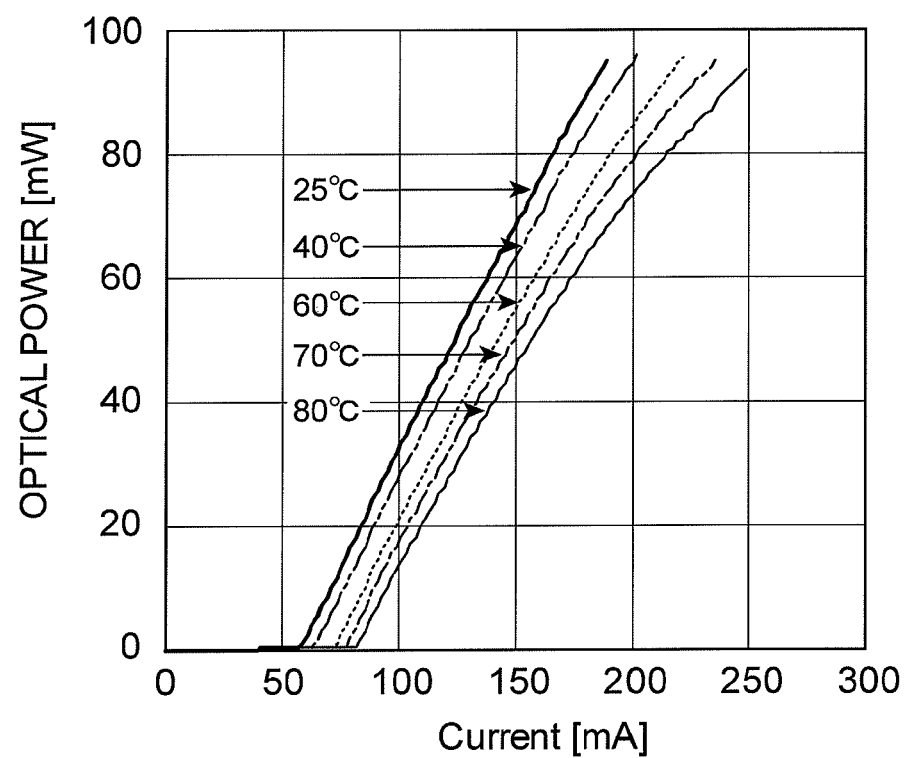
FIG. 10 is a view showing temperature dependence of the L-I curves of the semipolar {20-21} green LD lasing at 528.1 nm under CW operation.
Figure 11:
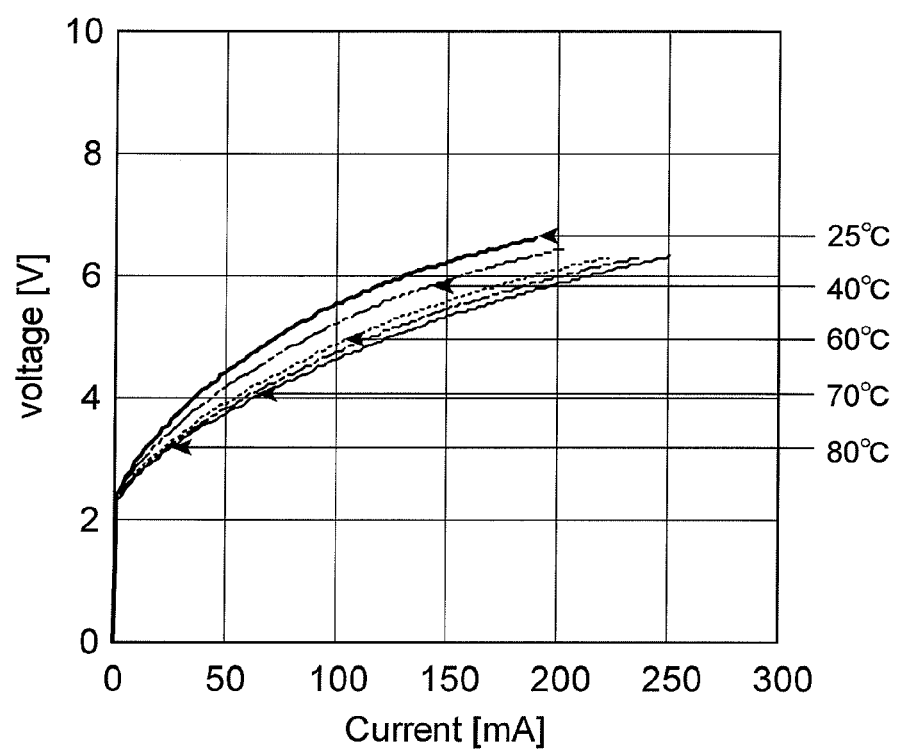
FIG. 11 is a view showing temperature dependence of the V-I curves of the semipolar {20-21} green LD lasing at 528.1 nm under CW operation.

The device characteristics of the inventors' recent semipolar {20-21} green laser diodes will be described below. The temperature dependence of light output power vs. current (L-I) and voltage vs. current curves for a typical green laser diodes under continuous wave operation are shown in FIGS. 10 and 11. The threshold current ($I_{th}$), threshold current density ($J_{th}$), and threshold voltage ($V_{th}$) at room temperature are 59 mA, 5.9 kA/cm$^2$, and 4.7 V, respectively. The lasing wavelength is 528.1 nm under 70 mW continuous wave operation at room temperature. Compared to the inventors' previous work, the $V_{th}$ has been reduced from 6.4 V to 4.7 V, which is achieved as the result of the optimization of the doping profile. Along with the improvement of the slope efficiencies discussed above, the reduction of $V_{th}$ contributes largely to the higher WPEs. In FIG. 10, one can see more than 90 mW output power even at 80 Celsius degrees despite a slight thermal roll over, which indicates that the green laser diodes are suitable for use in portable devices with limited heat sink capability. Recently, Non-Patent Literature 6 demonstrated semipolar green laser diodes with much higher characteristic temperatures ($T_0$) than those of c-plane green laser diodes, pointing out that the high $T_0$ values are attributed to intrinsic properties of InGaN quantum wells on the semipolar plane and that insertion of an electron-blocking layer is less crucial. The $T_0$ value derived from FIG. 10 is as high as 165 K. On the other hand, the present devices adopting electron-blocking layers have shown $T_0$ values of over 185 K under pulsed operation, indicating that suppression of carrier leakage plays a part in the improvement of the $T_0$.

In the present embodiment, the operation of InGaN green laser diodes on semipolar {20-21} GaN substrates with output powers of over 100 mW in the green spectral region beyond 530 nm has been demonstrated. Higher WPEs of 7.0-8.9% as compared to those of reported c-plane laser diodes are also realized in the wavelength range of 525-532 nm, which may be due to the high compositional homogeneity of In-rich InGaN quantum wells. The inventors think that the InGaN laser diodes on the {20-21} plane are promising candidates for application as light sources requiring high power in the green spectral region.

EXAMPLES 3

True green InGaN laser diodes on semipolar {20-21} GaN substrates have been fabricated with a wavelength beyond 525 nm under continuous wave (CW) operation by improving the structure of laser diodes and the growth condition of epitaxial layers. The lifetime of green lasers is estimated to be over 3,000 hours with an optical output power of 50 mW at 55 Celsius degrees of case-temperature (Tc), and over 1,000 hours with 70 mW at Tc of 55 Celsius degrees under CW operation.

Recently, InGaN green lasers have been extensively studied in prospect of their application for RGB-laser projectors. Although second harmonic generation green lasers are already developed, InGaN-based green laser diodes have attracted extra attention as direct emission sources with its compactness and high efficiency and reliability. A significant progress has already been made with respect to 515 nm InGaN laser diodes. It is known that the lifetime of 510-515 nm InGaN-based green laser diodes on c-plane GaN substrate is estimated to be over 5,000 hours under CW operation with an optical output power of 5 mW at 25 Celsius degrees. But longer lasing wavelength for green light source is expected to be used as projectors, especially over 525 nm. And then many researchers have tried to get lasing of longer wavelength. Several research groups have succeeded to fabricate laser diodes with a wavelength of around 530 nm. However, it is difficult to obtain a long lifetime because of its crystalline quality with the incorporation of high Indium contents for active layers and big consumption power. There are no reports of long lifetime with high output power at high temperature in the wavelength range beyond 525 nm.

In the present example, the inventors report a successful fabrication of InGaN based pure-green laser diodes on semipolar {20-21} GaN substrates, which lifetime is estimated to be over 3,000 hours under CW operation with an optical output power of 50 mW at Tc 55 Celsius degrees, and over 1,000 hours with 70 mW at Tc of 55 Celsius degrees. A key point of the life time is to use these semipolar {20-21} GaN substrates. There are advantages on the homogeneous InGaN active layers, the small piezoelectric polarization by using {20-21} GaN substrates. The inventors have studied lower threshold current densities of the {20-21} plane laser diodes with the wavelength beyond 520 nm in comparison with those of c-plane laser diodes, while the slope efficiencies needed to be improved. The present examples demonstrate the cavity length and the mirror reflectivity for the reduction the operating current and high slope efficiency, and reduction in the contact resistivity by studying the Mg-doping concentration and the thickness. This improvement of the slope efficiency and the low contact resistivity leads to the remarkable progress on the stable reliability.

Figure 12:
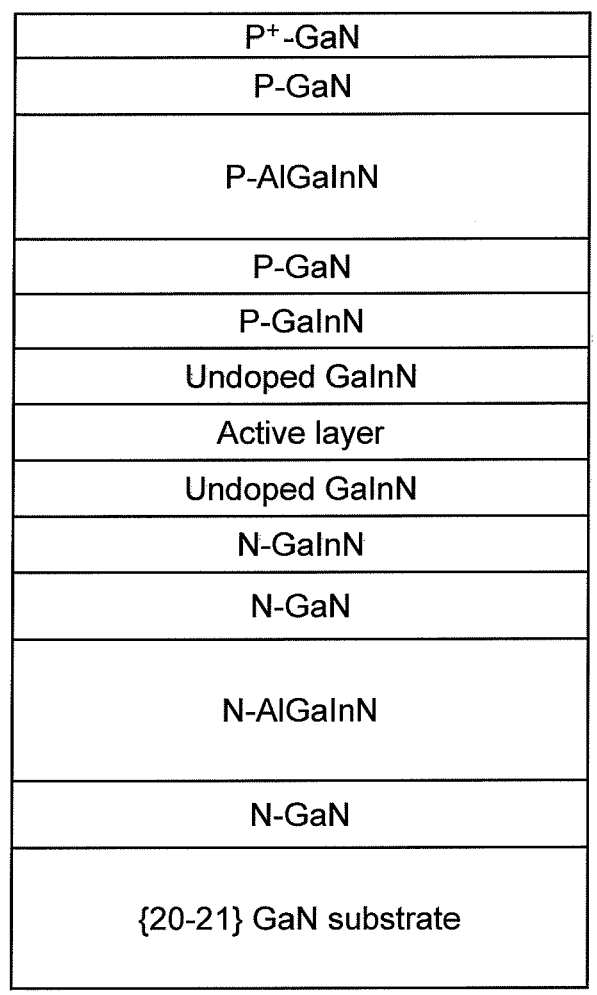
FIG. 12 is a schematic view showing the structure of a green laser diode in Example 3.

The laser structures are grown on free-standing semipolar {20-21} GaN substrates by metal organic vapor phase epitaxy (MOVPE). Trimethylgarium, Trimethylaluminum, Trimethylindium, and ammonia are used as source materials. Monosilane and Biscyclopentadienylmagnisium are used as n- and p-type dopant, respectively. FIG. 12 shows a schematic cross section of green laser diodes. The device structures are grown on semipolar {20-21} GaN substrates. Starting form substrate, it consists of n-type GaN, n-type InAlGaN cladding layer, n-type and undoped InGaN optical guiding layer, InGaN multi quantum wells active layer, undoped and p-type InGaN optical guiding layer, p-type AlGaN cladding layer, p-type GaN layer, and p$^+$-GaN contact layer. After the growth, a ridge structure is formed by dry etching. The laser stripe is formed along [−1014] due to the advantageous orientation for the semipolar {20-21} laser diodes. The width at the top of the ridge is approximately 1.5 μm. A 500 μm-long cavity is formed by fracturing, and each facet is coated with dielectric films of 55 and 97% in reflectivity.

Measurement of temperature dependence characteristics of green laser diodes is carried out. FIG. 13 shows the temperature dependence of the lasing peak wavelength of laser diode at output power of 50 mW under CW operation in the range from Tc 25 to 55 Celsius degrees. Part (a) of FIG. 13 shows typical lasing spectra of the green laser diodes beyond 525 nm. The peak wavelength shift is estimated to be 0.066 nm/K in Part (b) of FIG. 13.

FIG. 14 shows the far-field patterns (FFPs) of the lasing wavelength beyond 525 nm with an output power of 50 mW at the Tc of 25 to 55 Celsius degrees. FFPs are almost the same in this temperature range. Beam divergence angles are 16.6 and 23.2 degrees in the parallel direction (θ-parallel) and the perpendicular (θ-vertical) direction to the substrate plane, respectively. The aspect ratio (θ-vertical/θ-parallel) is 1.4. The results of θ-vertical and θ-parallel are shown in Parts (a) and (b) of FIG. 14, respectively. The aspect ratio can also be controlled by changing the parameter of device structures.

Figure 15:
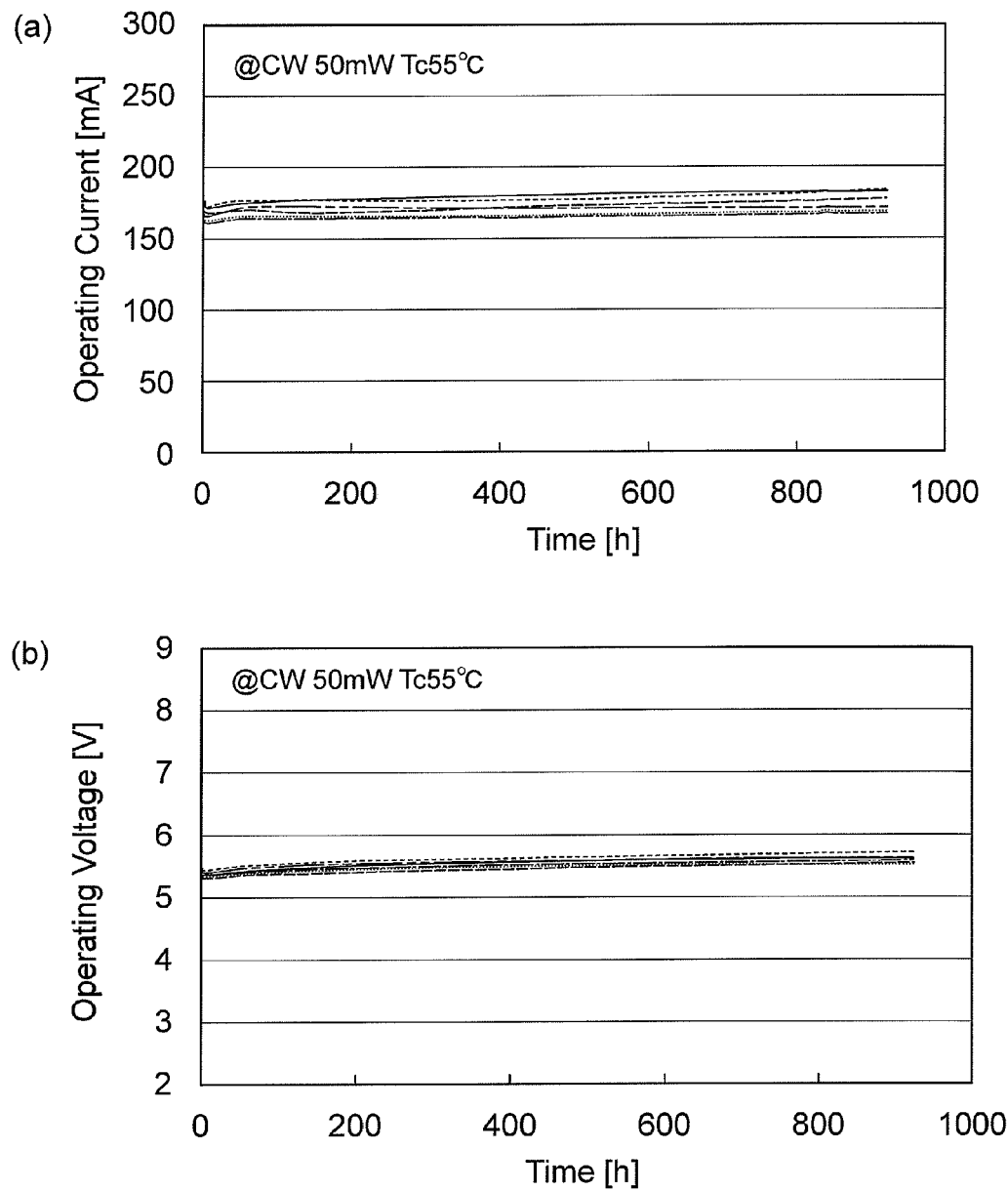
FIG. 15 is a view showing lifetime test results of six 525.5-531.2 nm true green laser diodes in CW operation under APC condition at 55 Celsius degrees of case temperature.

Reliability test data of several green laser diodes, which lasing wavelength are 527.5-531.2 nm, at optical output power level of 50 mW are shown in FIG. 15. Part (a) of FIG. 15 shows the time dependence of the operating current of laser diodes, and Part (b) of FIG. 15 shows the time dependence of the operating voltage of laser diodes. The number of devices is 6. A lifetime test is carried out at 55 Celsius degrees of case temperature in CW operation under automatic power control (APC) condition. The lifetime is defined as the estimate time at which the operating current becomes 1.3 times from the initial value. Aging profile shows little increase of operating current and operating voltage from the data at 900 hours. The lifetime is estimated to be over 3,000 hours with 50 mW at 55 Celsius degrees.

A lifetime test of CW-operated 528.2-529.1 nm laser diodes is carried out with an optical output power level of 70 mW shown in FIG. 16. The results of time dependence of the operating current of laser diodes are shown in Part (a) of FIG. 16 and the operating voltage of laser diodes are shown in Part (b) of FIG. 16. The number of devices is 2. A lifetime test under APC condition was carried out at 55 Celsius degrees of case temperature in CW operation. From the degradation rate of aging profile at 500 h, the lifetime is estimated to be over 1,000 hours with 70 mW at 55 Celsius degrees.

In the embodiment, InGaN-based true green laser diodes using semipolar {20-21} GaN substrates are demonstrated, and these laser diodes has a lasing wavelength beyond 525 nm and optical output power of 50-70 mW under CW operation at Tc of 55 Celsius degrees. The lifetime of these pure green laser diodes is estimated to be over at least 5,000 hours with 50 mW at 55 Celsius degrees, and to be over 1,000 hours with 70 mW at 55 Celsius degrees, respectively. Longer lifetime as compared to those of reported c-plane laser diodes is realized at the wavelength beyond 525 nm, which may be due to the weak piezoelectric fields and the high homogeneity of In-rich InGaN quantum wells, and high slope efficiency and low p-type contact resistivity. These results ensure that the green laser diodes on the {20-21} plane are promising candidates for the green light source of display applications.

As described above, the present embodiment can provide a group-III nitride semiconductor laser device that can reduce an operating current required to achieve a desired optical output.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A group-III nitride semiconductor laser device comprising:
   a laser structure including a support base and a semiconductor region, the support base including a group-III nitride semiconductor and having a semipolar primary surface, and the semiconductor region being provided on the semipolar primary surface of the support base;
   a first reflective layer for a lasing cavity of the group-III nitride semiconductor laser device, the first reflective layer being provided on a first end face of the semiconductor region; and
   a second reflective layer for the lasing cavity of the group-III nitride semiconductor laser device, the second reflective layer being provided on a second end face of the semiconductor region;
   the laser structure including a laser waveguide, the laser waveguide extending along the semipolar primary surface of the support base,
   the semiconductor region including an active layer,
   the active layer including a gallium nitride-based semiconductor layer,
   a c+ axis vector indicating a direction of a <0001> axis of the group-III nitride semiconductor of the support base, the c+ axis vector tilting at a tilt angle of not less than 63 degrees and less than 80 degrees with respect to a normal vector toward a crystal axis of an m-axis of the group-III nitride semiconductor, and the normal vector indicating a direction of an axis normal to the semipolar primary surface,
   the first reflective layer having a reflectance of less than 60% in a wavelength range of 525 to 545 nm, and
   the second reflective layer having a reflectance of 85% or more in the wavelength range of 525 to 545 nm,
   wherein, an end face of the support base and an end face of the semiconductor region are exposed at the first end face, and an end faces of the support base and an end faces of the semiconductor region are exposed at the second end face, and
   wherein, an angle defined by a reference plane and an end face of the active layer of the semiconductor region is in a range of (ALPHA−5) to (ALPHA+5) degrees on a first plane defined by a c-axis and the m-axis of the group-III nitride semiconductor, and the reference plane is orthogonal to an m-axis of the support base comprising the group-III nitride semiconductor.

2. The group-III nitride semiconductor laser device according to claim 1, further comprising a ridge structure.

3. The group-III nitride semiconductor laser device according to claim 2, wherein the semiconductor region includes a contact layer and an optical guiding layer, the contact layer comprises a group-III nitride, and the optical guiding layer comprises a group-III nitride, the optical guiding layer is provided between the active layer and the contact layer, and the ridge structure has a height large enough to include the contact layer and a part of the optical guiding layer.

4. The group-III nitride semiconductor laser device according to claim 1, wherein the first reflective layer has a reflectance of 30% or more within a wavelength range of 525 to 545 nm.

5. The group-III nitride semiconductor laser device according to claim 1, wherein the second reflective layer has a reflectance of 99.9% or less in the wavelength range of 525 to 545 nm.

6. The group-III nitride semiconductor laser device according to claim 1, wherein the first reflective layer has a reflectance of 35% or more in a wavelength range of 525 to 545 nm.

7. The group-III nitride semiconductor laser device according to claim 1, wherein the first reflective layer has a reflectance of 55% or less in a wavelength range of 525 to 545 nm.

8. The group-III nitride semiconductor laser device according to claim 1, wherein the first reflective layer has a reflectance of 50% or less in a wavelength range of 525 to 545 nm.

9. The group-III nitride semiconductor laser device according to claim 1, wherein the first reflective layer has a reflectance of 40% or more in a wavelength range of 525 to 545 nm.

10. The group-III nitride semiconductor laser device according to claim 1, wherein the tilt angle is 70 degrees or more.

11. The group-III nitride semiconductor laser device according to claim 1, wherein the tilt angle is less than 80 degrees.

12. The group-III nitride semiconductor laser device according to claim 1, wherein the primary surface of the support base tilts at an angle in a range of −4 to +4 degrees with respect to a {20-21} plane.

13. The group-III nitride semiconductor laser device according to claim 1, wherein the primary surface of the support base comprises a {20-21} plane.

14. The group-III nitride semiconductor laser device according to claim 1, wherein the support base comprises a GaN substrate.

15. The group-III nitride semiconductor laser device according to claim 1, wherein the first reflective layer comprises a dielectric multilayer, and the second reflective layer comprises a dielectric multilayer.

16. The group-III nitride semiconductor laser device according to claim 1, wherein the support base has a first substrate end face connected to the first end face of the semiconductor region, the first reflective layer is provided over the first substrate end face, the support base has a second substrate end face connected to the second end face of the semiconductor region, and the second reflective layer is provided over the second substrate end face.

17. The group-III nitride semiconductor laser device according to claim 1, further comprising an electrode provided on the semiconductor region of the laser structure, the electrode comprising a Pd electrode in contact with an upper surface of the semiconductor region.

18. The group-III nitride semiconductor laser device according to claim 1, wherein a difference between a reflectance of the first reflective layer and a reflectance of the second reflective layer exceeds 25%.

19. The group-III nitride semiconductor laser device according to claim 1, wherein the angle is in a range of −5 to +5 degrees on a second plane orthogonal to the first plane and the normal axis.

* * * * *